United States Patent
Seo et al.

(10) Patent No.: US 9,472,601 B2
(45) Date of Patent: *Oct. 18, 2016

(54) LIGHT-EMITTING DEVICE AND DISPLAY DEVICE

(71) Applicant: Semiconductor Energy Laboratory Co., Ltd., Kanagawa-ken (JP)

(72) Inventors: Satoshi Seo, Kanagawa (JP); Toshiki Sasaki, Kanagawa (JP); Nobuharu Ohsawa, Kanagawa (JP); Takahiro Ushikubo, Kanagawa (JP); Shunpei Yamazaki, Tokyo (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/683,695

(22) Filed: Apr. 10, 2015

(65) Prior Publication Data

US 2015/0221703 A1 Aug. 6, 2015

Related U.S. Application Data

(63) Continuation of application No. 13/368,834, filed on Feb. 8, 2012, now Pat. No. 9,006,755.

(30) Foreign Application Priority Data

Feb. 11, 2011 (JP) ................................. 2011-027961

(51) Int. Cl.
*H01L 29/18* (2006.01)
*H01L 21/00* (2006.01)
(Continued)

(52) U.S. Cl.
CPC ........... *H01L 27/322* (2013.01); *H01L 51/504* (2013.01); *H01L 51/5215* (2013.01);
(Continued)

(58) Field of Classification Search
CPC . H01L 27/30; H01L 27/3239; H01L 31/143; H01L 31/162; H01L 33/08; H01L 33/18; H01L 33/24; H01L 51/5032; H01L 25/048; H01L 27/288; H01L 27/32

USPC .............. 257/13, 79–103, 918, 40, 642–643, 257/759, E51.001, E51.052, 257/E25.008–E25.009; 438/22–47, 69, 438/493, 503, 507, 956
See application file for complete search history.

(56) References Cited

U.S. PATENT DOCUMENTS 6,847,163 B1    1/2005  Tsutsui et al.
7,057,339 B2    6/2006  Boroson et al.
(Continued)

FOREIGN PATENT DOCUMENTS

CN    102024844 A    4/2011
EP    2 023 422 A2   2/2009
(Continued)

OTHER PUBLICATIONS

Kashiwabara, M. et al., "29.5L: Late-News Paper: Advanced AM-OLED Display Based on White Emitter With Microcavity Structure," SID Digest '04: SID International Symposium Digest of Technical Papers, 2004, vol. 35, pp. 1017-1019.
(Continued)

*Primary Examiner* — Selim Ahmed
*Assistant Examiner* — Moin Rahman
(74) *Attorney, Agent, or Firm* — Husch Blackwell LLP

(57) ABSTRACT

A technique of manufacturing a display device with high productivity is provided. In addition, a high-definition display device with high color purity is provided. By adjusting the optical path length between an electrode having a reflective property and a light-emitting layer by the central wavelength of a wavelength range of light passing through a color filter layer, the high-definition display device with high color purity is provided without performing selective deposition of light-emitting layers. In a light-emitting element, a plurality of light-emitting layers emitting light of different colors are stacked. The closer the light-emitting layer is to the electrode having a reflective property, the longer the wavelength of light emitted from the light-emitting layer is.

44 Claims, 8 Drawing Sheets

(51) Int. Cl.
  *H01L 27/32*   (2006.01)
  *H01L 51/50*   (2006.01)
  *H01L 51/52*   (2006.01)

(52) U.S. Cl.
  CPC ....... *H01L51/5218* (2013.01); *H01L 51/5234* (2013.01); *H01L 51/5265* (2013.01); *H01L 51/5278* (2013.01); *H01L 2251/558* (2013.01)

(56) References Cited

U.S. PATENT DOCUMENTS

| | | |
|---|---|---|
| 7,271,537 B2 | 9/2007 | Matsuda et al. |
| 7,317,282 B2 | 1/2008 | Tsutsui et al. |
| 7,462,883 B2 | 12/2008 | Kumaki et al. |
| 7,554,265 B2 | 6/2009 | Godo et al. |
| 7,564,052 B2 | 7/2009 | Kumaki |
| 7,601,988 B2 | 10/2009 | Seo et al. |
| 7,737,626 B2 | 6/2010 | Kumaki et al. |
| 7,753,751 B2 | 7/2010 | Yamazaki |
| 7,812,521 B2 | 10/2010 | Mori et al. |
| 7,851,989 B2 | 12/2010 | Noda |
| 7,875,893 B2 | 1/2011 | Seo et al. |
| 7,893,427 B2 | 2/2011 | Kumaki et al. |
| 7,903,055 B2 | 3/2011 | Nishikawa et al. |
| 7,964,891 B2 | 6/2011 | Kumaki et al. |
| 7,973,319 B2 | 7/2011 | Kashiwabara et al. |
| 8,008,652 B2 | 8/2011 | Kumaki et al. |
| 8,080,934 B2 | 12/2011 | Kido et al. |
| 8,405,098 B2 | 3/2013 | Matsunami et al. |
| 9,006,755 B2 * | 4/2015 | Seo et al. ............ 257/88 |
| 2004/0041147 A1 | 3/2004 | Park |
| 2004/0145303 A1 | 7/2004 | Yamada et al. |
| 2005/0218799 A1 | 10/2005 | Hamada |
| 2006/0163597 A1 | 7/2006 | Noda et al. |
| 2006/0267483 A1 | 11/2006 | Tsutsui et al. |
| 2006/0284204 A1 | 12/2006 | Yamazaki et al. |
| 2007/0001570 A1 | 1/2007 | Nomura et al. |
| 2007/0069996 A1 | 3/2007 | Kuba et al. |
| 2007/0102737 A1 | 5/2007 | Kashiwabara et al. |
| 2007/0176161 A1 | 8/2007 | Seo et al. |
| 2007/0182317 A1 | 8/2007 | Kido et al. |
| 2008/0111474 A1 | 5/2008 | Sung et al. |
| 2008/0231177 A1* | 9/2008 | Nomura ............... C09K 11/06 313/504 |
| 2008/0241586 A1 | 10/2008 | Kumaki et al. |
| 2009/0275161 A1 | 11/2009 | Kumaki et al. |
| 2010/0176720 A1 | 7/2010 | Yamazaki |
| 2011/0062475 A1 | 3/2011 | Cho |
| 2011/0101345 A1 | 5/2011 | Kumaki et al. |
| 2011/0101380 A1 | 5/2011 | Kumaki et al. |
| 2011/0108864 A1 | 5/2011 | Seo et al. |
| 2011/0140101 A1 | 6/2011 | Noda |
| 2011/0187259 A1 | 8/2011 | Fukuda et al. |
| 2011/0187260 A1 | 8/2011 | Fukuda et al. |
| 2011/0241007 A1 | 10/2011 | Kumaki et al. |
| 2011/0278562 A1 | 11/2011 | Kumaki et al. |
| 2011/0291088 A1 | 12/2011 | Seo et al. |
| 2011/0309351 A1 | 12/2011 | Kumaki et al. |
| 2012/0205685 A1 | 8/2012 | Seo et al. |
| 2012/0205686 A1 | 8/2012 | Seo et al. |

FOREIGN PATENT DOCUMENTS

| | | |
|---|---|---|
| EP | 2 296 203 A2 | 3/2011 |
| EP | 2 487 734 A2 | 8/2012 |
| JP | 2006-073484 A | 3/2006 |
| JP | 2006-126817 A | 5/2006 |
| JP | 2006-228712 A | 8/2006 |
| JP | 2006-302506 A | 11/2006 |
| JP | 2006-324016 A | 11/2006 |
| JP | 2009-043684 A | 2/2009 |
| JP | 2009-064605 A | 3/2009 |
| JP | 2009-266459 A | 11/2009 |
| JP | 2009-266524 A | 11/2009 |
| JP | 2010-003577 A | 1/2010 |
| JP | 2010-129301 A | 6/2010 |
| JP | 2010-287484 A | 12/2010 |
| JP | 2011-065992 A | 3/2011 |
| JP | 2011-076769 A | 4/2011 |
| JP | 2011-159430 A | 8/2011 |
| KR | 2011-0029311 A | 3/2011 |
| TW | 200605722 | 2/2006 |
| WO | WO 2005/098987 A2 | 10/2005 |
| WO | WO 2006/078005 A1 | 7/2006 |

OTHER PUBLICATIONS

Matsumoto, T. et al., "27.5L: Late-News Paper: Multiphoton Organic EL Device Having Charge Generation Layer", SID Digest '03: SID International Symposium Digest of Technical Papers, 2003, vol. 34, pp. 979-981.

International Search Report re Application No. PCT/JP2012/052907, dated May 1, 2012.

Written Opinion re Application No. PCT/JP2012/052907, dated May 1, 2012.

* cited by examiner

LIGHT-EMITTING DEVICE AND DISPLAY DEVICE

This application is a continuation of copending U.S. application Ser. No. 13/368,834, filed on Feb. 8, 2012 which is incorporated herein by reference.

TECHNICAL FIELD

One embodiment of the present invention relates to an electroluminescent display device and a manufacturing method of the display device.

BACKGROUND ART

In recent years, an electroluminescent (also referred to as EL) display device has attracted attention as a display device with reduced thickness and weight (i.e., so-called flat panel display).

Light-emitting elements using light-emitting materials emitting light of different colors are provided as light-emitting elements used in pixels in an EL display device, so that full-color display can be performed.

For such an EL display device, a method is used in which selective deposition of light-emitting materials in a minute pattern is performed for each pixel by an evaporation method using a metal mask.

However, a shape defect or emission defect might be caused to a light-emitting element due to contact of a metal mask, and ways to prevent the defects have been explored (e.g., Patent Document 1). Patent Document 1 discloses a structure in which a spacer for supporting a metal mask is provided over a pixel electrode so that the metal mask and the pixel electrode are not in contact with each other at the time of evaporation.

REFERENCE

[Patent Document 1] Japanese Published Patent Application No. 2006-126817

DISCLOSURE OF INVENTION

A method in which selective deposition of light-emitting materials is performed for each pixel has a complicated process; thus, yield or productivity is difficult to increase.

An object of one embodiment of the present invention is to provide a light-emitting element with which a reduction in power consumption and an increase in productivity of a display device can be achieved.

An object of one embodiment of the present invention is to provide a high-definition display device with high color purity.

According to one embodiment of the present invention, the optical path length between an electrode having a reflective property and a light-emitting layer is adjusted by a central wavelength of a color filter layer, whereby a high-definition display device with high color purity is provided without performing selective deposition of light-emitting layers. In a light-emitting element, a plurality of light-emitting layers which emit light of different colors are stacked, and the closer the light-emitting layer is to an electrode having a reflective property, the longer the wavelength of light emitted from the light-emitting layer is. Specifically, structures described below are employed, for example.

One embodiment of the present invention is a display device which includes a first pixel including a first color filter layer and a second pixel including a second color filter layer. The first pixel includes a first light-emitting element including a first electrode having a reflective property. The second pixel includes a second light-emitting element including a second electrode having a reflective property. The first light-emitting element and the second light-emitting element includes, over the respective first and second electrodes having reflective properties, a first light-emitting layer, a charge generation layer, a second light-emitting layer, and an electrode having a light-transmitting property which are stacked in this order. In the first pixel, the optical path length between the first electrode having a reflective property and the first light-emitting layer is one-quarter of the central wavelength of a wavelength range of light passing through the first color filter layer. In the second pixel, the optical path length between the second electrode having a reflective property and the second light-emitting layer is m-quarters (m is an odd number of three or more), preferably three-quarters of the central wavelength of a wavelength range of light passing through the second color filter layer. The central wavelength of the wavelength range of light passing through the first color filter layer is longer than the central wavelength of the wavelength range of light passing through the second color filter layer.

In the above structure, the wavelength of a color of light emitted from the first light-emitting layer is longer than the wavelength of a color of light emitted from the second light-emitting layer. Further, the second light-emitting element may include a conductive layer having a light-transmitting property between the second electrode having a reflective property and the first light-emitting layer.

One embodiment of the present invention is a display device which includes a first pixel including a first color filter layer, a second pixel including a second color filter layer, and a third pixel including a third color filter layer. The first pixel includes a first light-emitting element including a first electrode having a reflective property. The second pixel includes a second light-emitting element including a second electrode having a reflective property. The third pixel includes a third light-emitting element including a third electrode having a reflective property. The first light-emitting element, the second light-emitting element, and the third light-emitting element include, over the respective first, second, and third electrodes having reflective properties, a first light-emitting layer, a charge generation layer, a second light-emitting layer, a third light-emitting layer, and an electrode having a light-transmitting property which are stacked in this order. In the first pixel, the optical path length between the first electrode having a reflective property and the first light-emitting layer is one-quarter of the central wavelength of a wavelength range of light passing through the first color filter layer. In the second pixel, the optical path length between the second electrode having a reflective property and the second light-emitting layer is m-quarters (m is an odd number of three or more), preferably three-quarters of the central wavelength of a wavelength range of light passing through the second color filter layer. In the third pixel, the optical path length between the third electrode having a reflective property and the third light-emitting layer is n-quarters (n is an odd number of three or more), preferably five-quarters of the central wavelength of a wavelength range of light passing through the third color filter layer. The central wavelength of the wavelength range of light passing through the first color filter layer is longer than the central wavelength of the wavelength range of light passing through the second color filter layer. The central wavelength of the wavelength range of light passing through the second color filter layer is longer than the central wavelength of the wavelength range of light passing through the third color filter layer.

In the above structure, the wavelength of a color of light emitted from the first light-emitting layer is longer than the wavelength of a color of light emitted from the second light-emitting layer; the wavelength of a color of light emitted from the second light-emitting layer is longer than the wavelength of a color of light emitted from the third light-emitting layer. Further, the second light-emitting element may include a conductive layer having a light-transmitting property between the second electrode having a reflective property and the first light-emitting layer; the third light-emitting element may include a conductive layer having a light-transmitting property between the third electrode having a reflective property and the first light-emitting layer. The conductive layer having a light-transmitting property included in the second light-emitting element may have a thickness different from that of the conductive layer having a light-transmitting property included in the third light-emitting element.

According to one embodiment of the present invention, a display device can be manufactured with high productivity.

According to one embodiment of the present invention, a high-definition display device can be provided.

Further, according to one embodiment of the present invention, a display device with low power consumption can be provided.

BRIEF DESCRIPTION OF DRAWINGS

FIGS. 1A, 1B1, and 1B2 are views each illustrating a display device.

FIGS. 2A, 2B1, 2B2, and 2B3 are views each illustrating a display device.

FIG. 3 is a view illustrating a display device.

BEST MODE FOR CARRYING OUT THE INVENTION

Figure 1A:
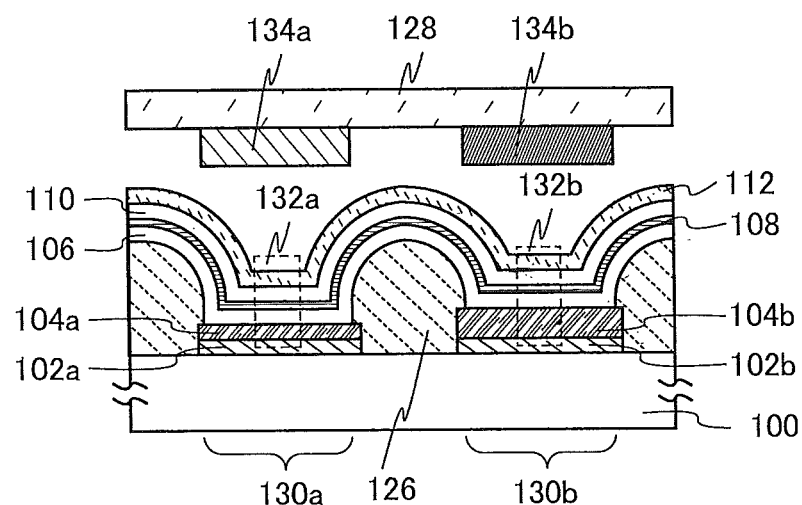

Embodiments will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description of the embodiments below. In the structures to be given below, the same portions or portions having similar functions are denoted by the same reference numerals in different drawings, and explanation thereof will not be repeated.

Embodiment 1

In this embodiment, one embodiment of an EL display device will be described with reference to FIGS. 1A and 1B, FIGS. 2A, 2B1, 2B2, and 2B3, and FIGS. 3A to 3C.

Figure 1A:
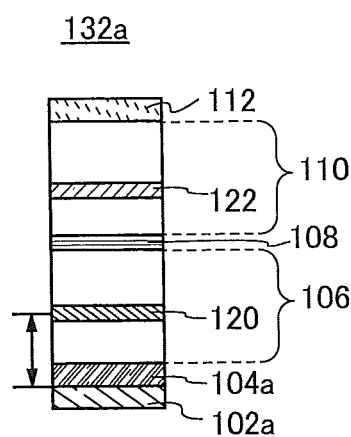
Figure 1A:
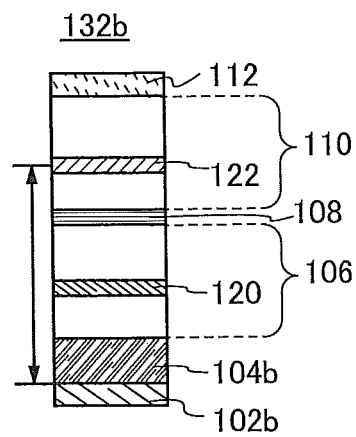

FIG. 1A is a cross-sectional view of a display portion in a display device of this embodiment. FIGS. 1B1 and 1B2 are enlarged views of part of the cross-sectional view of FIG. 1A.

The display device illustrated in FIG. 1A includes a first pixel 130a and a second pixel 130b. The first pixel 130a includes a first light-emitting element 132a provided over a substrate 100 and a first color filter layer 134a provided for a counter substrate 128 in a region overlapping with the first light-emitting element 132a. The second pixel 130b includes a second light-emitting element 132b provided over the substrate 100 and a second color filter layer 134b provided for the counter substrate 128 in a region overlapping with the second light-emitting element 132b.

In the display device illustrated in FIG. 1A, the first color filter layer 134a and the second color filter layer 134b transmit light with different wavelengths. The central wavelength of the wavelength range of light passing through the first color filter layer 134a and the central wavelength of the wavelength range of light passing through the second color filter layer 134b are made to be different from each other, whereby a display device capable of multicolor display can be obtained. In this embodiment, the case where the central wavelength of the wavelength range of light passing through the first color filter layer 134a (hereinafter, also referred to as $\lambda 1$) is longer than the central wavelength of the wavelength range of light passing through the second color filter layer 134b (hereinafter, also referred to as $\lambda 2$) will be described as an example.

Note that in this specification, the term "central wavelength" refers to the central wavelength of a wavelength range of light passing through a color filter layer (preferably, a wavelength range of a transmittance of 50% or more) in the visible light range (380 nm to 680 nm). For example, in the case where a red color filter layer transmits light in the wavelength range of 600 nm to 680 nm, the central wavelength is 640 nm. In the case where a green color filter layer transmits light in the wavelength range of 510 nm to 590 nm, the central wavelength is 550 nm. In the case where a blue color filter layer transmits light in the wavelength range of 380 nm to 520 nm, the central wavelength is 450 nm.

Note that a blue color filter layer and a green color filter layer each have an absorption spectrum in the long wavelength region around 700 nm in some cases. However, the absorption spectrum in the above long wavelength region does not affect the luminosity; therefore, the absorption spectrum in the region is excluded. Thus, the visible light region in this specification and the like is a region with a wavelength of 680 nm or less.

The first light-emitting element 132a and the second light-emitting element 132b respectively include a first electrode 102a having a reflective property and a second electrode 102b having a reflective property which are placed with a distance therebetween over the substrate 100. The first light-emitting element 132a and the second light-emitting element 132b are electrically insulated from each other by an insulating layer 126.

The first light-emitting element 132a includes a first conductive layer 104a having a light-transmitting property, a first EL layer 106, a charge generation layer 108, a second EL layer 110, and an electrode 112 having a light-transmitting property which are stacked in this order over the first electrode 102a having a reflective property. The second light-emitting element 132b includes a second conductive layer 104b having a light-transmitting property, the first EL layer 106, the charge generation layer 108, the second EL layer 110, and the electrode 112 having a light-transmitting property which are stacked in this order over the second electrode 102b having a reflective property. In this embodiment, light emitted from the first light-emitting element 132a and the second light-emitting element 132b is extracted from the electrode 112 side.

Note that the first EL layer 106, the charge generation layer 108, the second EL layer 110, and the electrode 112 having a light-transmitting property are used in both the first light-emitting element 132a and the second light-emitting element 132b and are each formed as a continuous film.

FIG. 1B1 is an enlarged view of the first light-emitting element 132a. FIG. 1B2 is an enlarged view of the second light-emitting element 132b.

In FIGS. 1B1 and 1B2, the first light-emitting element 132a and the second light-emitting element 132b each include the first EL layer 106 including at least a first light-emitting layer 120 and the second EL layer 110 including at least a second light-emitting layer 122. Note that each of the first EL layer 106 and the second EL layer 110 can have a stacked-layer structure including functional layers such as a hole-injection layer, a hole-transport layer, an electron-transport layer, and an electron-injection layer, in addition to the light-emitting layer.

The first conductive layer 104a having a light-transmitting property and the second conductive layer 104b having a light-transmitting property, which has a different thickness from the first conductive layer 104a having a light-transmitting property are included in the first light-emitting element 132a and the second light-emitting element 132b, respectively; therefore, the total thickness of the first light-emitting element 132a and the total thickness of the second light-emitting element 132b are different.

The first conductive layer 104a having a light-transmitting property has a function of adjusting the optical path length of light which is emitted from the first light-emitting layer 120 and reflected back by the first electrode 102a having a reflective property (the light is also referred to as first reflected light) by adjusting the thickness of the first conductive layer 104a having a light-transmitting property. The first reflected light interferes with light entering the first color filter layer 134a directly from the first light-emitting layer 120 (the light is also referred to as first entering light). Thus, the phases of the first entering light and the first reflected light are aligned by adjusting the thickness of the first conductive layer 104a having a light-transmitting property, whereby light emitted from the first light-emitting layer 120 can be amplified. Thus, the luminance of the light-emitting element according to this embodiment is higher than the luminance of a light-emitting element in which the optical path length is not adjusted, in the case where the same current is applied to these light-emitting elements. In addition, the phases of the first entering light and the first reflected light are aligned with the central wavelength of the wavelength range of light passing through the first color filter layer 134a, whereby the color purity of light extracted from the first pixel 130a can be increased.

The second conductive layer 104b having a light-transmitting property has a function of adjusting the optical path length of light which is emitted from the second light-emitting layer 122 and reflected back by the second electrode 102b having a reflective property (the light is also referred to as second reflected light) by adjusting the thickness of the second conductive layer 104b having a light-transmitting property. The second reflected light interferes with light entering the second color filter layer 134b directly from the second light-emitting layer 122 (the light is also referred to as second entering light). Thus, the phases of the second entering light and the second reflected light are aligned by adjusting the thickness of the second conductive layer 104b having a light-transmitting property, whereby light emitted from the second light-emitting layer 122 can be amplified. Thus, the luminance of the light-emitting element according to this embodiment is higher than the luminance of a light-emitting element in which the optical path length is not adjusted, in the case where the same current is applied to these light-emitting elements. In addition, the phases of the second entering light and the second reflected light are aligned with the central wavelength of the wavelength range of light passing through the second color filter layer 134b, whereby the color purity of light extracted from the second pixel 130b can be increased.

Specifically, it is preferable that the optical path length between the first electrode 102a having a reflective property and the first light-emitting layer 120 in the first light-emitting element 132a included in the first pixel 130a be one-quarter of the central wavelength of the wavelength range of light passing through the first color filter layer 134a ($\lambda 1$). Moreover, it is preferable that the optical path length between the second electrode 102b having a reflective property and the second light-emitting layer 122 in the second light-emitting element 132b included in the second pixel 130b be three-quarters of the central wavelength of the wavelength range of light passing through the second color filter layer 134b ($\lambda 2$).

More strictly, the optical path length between the first electrode 102a having a reflective property and the first light-emitting layer 120 can also be referred to as the optical path length between the first electrode 102a having a reflective property and a light-emitting region in the first light-emitting layer 120. Note that it is difficult to strictly determine the position of the light-emitting region in a light-emitting layer and that the effects described above can be sufficiently obtained by assuming any position in the light-emitting layer as the position of the light-emitting region. In other words, the optical path length between the first electrode 102a having a reflective property and the first light-emitting layer 120 can be referred to as the optical path length between a surface of the first electrode 102a having a reflective property and a lower surface of the first light-emitting layer 120 or more and the optical path length between the surface of the first electrode 102a having a reflective property and an upper surface of the first light-emitting layer 120 or less. The same can be applied to the optical path length between the second electrode 102b having a reflective property and the second light-emitting layer 122, and the optical path length between the third electrode 102c having a reflective property and the third light-emitting layer 124, which will be described later.

Further, the spectrum of light emitted from the first light-emitting layer 120 preferably has a peak in the wavelength region exhibiting the same color as the central wavelength of the wavelength range of light passing through the first color filter layer 134a. For example, in the case where the first color filter layer 134a has a central wavelength in the red region (e.g., the case where the central wavelength is 690 nm), the spectrum of light emitted from the first light-emitting layer 120 preferably has a peak in the range of 600 nm to 700 nm.

In a similar manner, the spectrum of light emitted from the second light-emitting layer 122 preferably has a peak in the wavelength region exhibiting the same color as the central wavelength of the wavelength range of light passing through the second color filter layer 134b. For example, in the case where the second color filter layer 134b has a central wavelength in the green region (e.g., the case where the central wavelength is 550 nm), the spectrum of light emitted from the second light-emitting layer 122 preferably has a peak in the range of 520 nm to 550 nm.

Note that in this embodiment, the central wavelength of the wavelength range of light passing through the first color filter layer 134a is longer than the central wavelength of the wavelength range of light passing through the second color filter layer 134b; therefore, it is preferable that the wavelength of a color of light emitted from the first light-emitting layer 120 be longer than the wavelength of a color of light emitted from the second light-emitting layer 122.

Further, in the first light-emitting element 132a, the optical path length between the first electrode 102a having a reflective property and the first light-emitting layer 120 is set to one-quarter of the central wavelength of the wavelength range of light passing through the first color filter layer 134a ($\lambda 1$), the optical path length between the second light-emitting layer 122 and the electrode 112 having a light-transmitting property is set to one-quarter of the central wavelength of the wavelength range of light passing through the second color filter layer 134b ($\lambda 2$), and the optical path length between the first electrode 102a having a reflective property and the electrode 112 having a light-transmitting property is set to one-half of the central wavelength of the wavelength range of light passing through the first color filter layer 134a ($\lambda 1$), whereby a cavity effect can be obtained.

By setting the first light-emitting element 132a under the above conditions, even in the second light-emitting element 132b in which the optical path length between the second electrode 102b having a reflective property and the second light-emitting layer 122 is three-quarters of the central wavelength ($\lambda 2$) of the second color filter layer 134b, the optical path length between the second light-emitting layer 122 and the electrode 112 having a light-transmitting property becomes one-quarter of the central wavelength ($\lambda 2$) of the second color filter layer 134b and the optical path length between the second electrode 102b having a reflective property and the electrode 112 having a light-transmitting property becomes the central wavelength ($\lambda 2$) of the second color filter layer 134b. Thus, a cavity effect can be obtained. The color purity is further improved by the cavity effect.

The structure of the display device illustrated in FIG. 1A will be described below along with specific materials. Note that an element structure, a manufacturing method, and the like described here are just examples, and other known structures, materials, and manufacturing methods can be applied without departing from the purpose of this embodiment.

Plastic (an organic resin), glass, quartz, or the like can be used for the substrate 100. As an example of plastic, a member made of polycarbonate, polyarylate, polyethersulfone, or the like can be given. Plastic is preferably used for the substrate 100, in which case a reduction in the weight of the display device can be achieved. Alternatively, a sheet with a high barrier property against water vapor and a high heat radiation property (e.g., a sheet including diamond like carbon (DLC)) can be used for the substrate 100.

Although not illustrated, a structure in which an inorganic insulator is provided over the substrate 100 may be employed. The inorganic insulator functions as a protective layer or a sealing film which blocks an external contaminant such as water. By providing the inorganic insulator, deterioration of the light-emitting element can be suppressed; thus, the durability and lifetime of the display device can be improved.

A single layer or a stack of a nitride film and a nitride oxide film can be used as the inorganic insulator. Specifically, the inorganic insulator can be formed using silicon oxide, silicon nitride, silicon oxynitride, aluminum oxide, aluminum nitride, aluminum oxynitride, or the like by a CVD method, a sputtering method, or the like depending on the material. It is preferable that the inorganic insulator be formed using silicon nitride by a CVD method. The thickness of the inorganic insulator may be greater than or equal to 100 nm and less than or equal to 1 µm. Alternatively, an aluminum oxide film, a DLC film, a carbon film containing nitrogen, or a film containing zinc sulfide and silicon oxide ($ZnS.SiO_2$ film) may be used as the inorganic insulator.

Alternatively, a thin glass substrate can be used as the inorganic insulator. For example, a glass substrate with a thickness greater than or equal to 30 µm and less than or equal to 100 µm can be used.

A metal plate may be provided on a bottom surface of the substrate 100 (a surface opposite to the surface over which the light-emitting element is provided). In the case where an inorganic insulator is provided, a metal plate may be used instead of the substrate 100. Although there is no particular limitation on the thickness of the metal plate, a metal plate with a thickness greater than or equal to 10 µm and less than or equal to 200 µm is preferably used, in which case a reduction in the weight of the display device can be achieved. Further, although there is no particular limitation on the material of the metal plate, a metal such as aluminum, copper, or nickel, a metal alloy such as an aluminum alloy or stainless steel, or the like can be preferably used.

The metal plate and the substrate 100 can be bonded to each other with an adhesive layer. As the adhesive layer, a visible light curable adhesive, an ultraviolet curable adhesive, or a thermosetting adhesive can be used. As examples of materials of such adhesives, an epoxy resin, an acrylic resin, a silicone resin, a phenol resin, and the like can be given. A moisture-absorbing substance serving as a desiccant may be contained in the adhesive layer.

A metal plate has low permeability; thus, by providing the metal plate, the entry of moisture into the light-emitting element can be prevented. Consequently, by providing the metal plate, a highly reliable display device in which deterioration due to moisture is suppressed can be provided.

The first electrode 102a having a reflective property and the second electrode 102b having a reflective property are provided opposite to the side where light is extracted and is formed using a material having a reflective property. As the material having a reflective property, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. As examples of a material of the metal film or the metal oxide film, titanium, titanium oxide, and the like are given. The above materials are preferable because they are present in large amounts in the Earth's crust and inexpensive to achieve a reduction in manufacturing cost of a light-emitting element.

In this embodiment, the case where the first electrode 102a having a reflective property and the second electrode 102b having a reflective property are used as an anode of the light-emitting element is described as an example. However, one embodiment of the present invention is not limited thereto.

The first conductive layer 104a having a light-transmitting property and the second conductive layer 104b having a light-transmitting property are formed of a single layer or stacked layers using a material having a property of transmitting visible light. As the material having light-transmitting property, for example, indium oxide, indium tin oxide, an indium oxide-zinc oxide alloy, zinc oxide, zinc oxide to which gallium is added, graphene, or the like can be used.

The conductive layer having a light-transmitting property can be formed using a conductive composition containing a conductive high molecule (also referred to as conductive polymer). As the conductive high molecule, a so-called π-electron conjugated conductive polymer can be used. For example, polyaniline or a derivative thereof, polypyrrole or a derivative thereof, polythiophene (PEDOT) or a derivative thereof, a copolymer of two or more of aniline, pyrrole, and thiophene or a derivative thereof, and the like can be given.

Note that the first electrode 102a having a reflective property, the second electrode 102b having a reflective property, the first conductive layer 104a having a light-transmitting property, and the second conductive layer 104b having a light-transmitting property can be processed into a desired shape in a photolithography step and an etching step. Thus, a minute pattern can be formed with good controllability, which makes it possible to obtain a high-definition display device.

Further, when the first conductive layer 104a having a light-transmitting property and the second conductive layer 104b having a light-transmitting property are provided independently in each pixel, crosstalk can be prevented even in the case where the thickness of the conductive layer having a light-transmitting property is extremely large or the case where the conductivity of the conductive layer having a light-transmitting property is high.

An insulating layer 126 having openings is formed over the first conductive layer 104a having a light-transmitting property and the second conductive layer 104b having a light-transmitting property. The first EL layer 106 is in contact with the first conductive layer 104a having a light-transmitting property and the second conductive layer 104b having a light-transmitting property through the openings. The insulating layer 126 is formed using an organic insulating material such as polyimide, acrylic, polyamide, or epoxy, or an inorganic insulating material. It is particularly preferable that the insulating layer 126 be formed using a photosensitive resin material to have an opening over each of the first conductive layer 104a having a light-transmitting property and the second conductive layer 104b having a light-transmitting property so that the sidewall of the opening is formed to have a tilted surface with continuous curvature. The insulating layer 126 may be tapered or inversely tapered.

The first EL layer 106 may include at least the first light-emitting layer 120. In addition, the first EL layer 106 can have a stacked-layer structure in which a layer containing a substance having a high hole-transport property, a layer containing a substance having a high electron-transport property, a layer containing a substance having a high hole-injection property, a layer containing a substance having a high electron-injection property, a layer containing a bipolar substance (a substance having a high hole-transport and electron-transport properties), and the like are combined as appropriate. For example, the first EL layer 106 can have a stacked-layer structure including a hole-injection layer, a hole-transport layer, the first light-emitting layer 120, an electron-transport layer, and an electron-injection layer. Needless to say, in the case where the first electrode 102a having a reflective property and the second electrode 102b having a reflective property are used as a cathode, a stacked-layer structure in which an electron-injection layer, an electron-transport layer, the first light-emitting layer 120, a hole-transport layer, and a hole-injection layer are stacked in this order from the cathode side may be employed.

The hole-injection layer is a layer containing a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: $H_2Pc$), or copper(II) phthalocyanine (abbreviation: CuPc) can also be used.

Any of the following aromatic amine compounds which are low molecular organic compounds can also be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Any of the high molecular compounds (e.g., oligomers, dendrimers, or polymers) can also be used. Examples of the high molecular compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can also be used.

In particular, it is preferable to use a composite material in which an acceptor substance is mixed with an organic compound having a high hole-transport property for the hole-injection layer. With the use of the composite material in which an acceptor substance is mixed with a substance having a high hole-transport property, excellent hole injection from the anode can be obtained, which results in a reduction in the driving voltage of the light-emitting element. Such a composite material can be formed by co-evaporation of a substance having a high hole-transport property and a substance having an acceptor property. When the hole-injection layer is formed using the composite material, holes are easily injected into the first EL layer 106 from the anode.

As the organic compound for the composite material, a variety of compounds such as an aromatic amine compound, carbazole derivatives, aromatic hydrocarbon, and a high molecular compound (such as oligomer, dendrimer, or polymer) can be used. The organic compound used for the composite material is preferably an organic compound having a high hole-transport property. Specifically, a substance having a hole mobility of $10^{-6}$ cm$^2$/Vs or higher is preferably used. Note that any other substances may also be used as long as the hole-transport property thereof is higher than the electron-transport property thereof. Specific examples of the organic compound that can be used for the composite material will be given below.

As the organic compound that can be used for the composite material, any of the following can be used: aromatic amine compounds such as TDATA, MTDATA, DPAB, DNTPD, DPA3B, PCzPCA1, PCzPCA2, PCzPCN1,4,4'-bis[N-(1-naphthyl)-N-phenylamino]biphenyl (abbreviation: NPB or α-NPD), N,N'-bis(3-methylphenyl)-N,N-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives, such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Any of the following aromatic hydrocarbon compounds can also be used: 2-tert-butyl-9,10-di(2-naphthyl)anthracene (abbreviation: t-BuDNA), 2-tert-butyl-9,10-di(1-naphthyl) anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl) anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Any of the following aromatic hydrocarbon compounds can also be used: 2,3,6,7-tetramethyl-9,10-di(2-naphthyl) anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl) phenyl]anthracene (abbreviation: DPVPA).

Examples of the electron acceptor include organic compounds such as 7,7,8,8-tetracyano-2,3,5,6-tetrafluoroquinodimethane (abbreviation: F$_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is particularly preferable because it is stable in the air, has a low hygroscopic property, and is easily handled.

Note that the hole injection layer may be formed using a composite material of the high molecular compound such as PVK, PVTPA, PTPDMA, or Poly-TPD, and the electron acceptor.

Note that in the case where a layer containing the above composite material is provided in the first EL layer 106, the optical path length of the first reflected light may be adjusted by adjusting the thickness of the layer containing the above composite material. In that case, the first conductive layer 104a having a light-transmitting property is not necessarily provided.

The hole-transport layer is a layer containing a substance having a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones having a hole mobility of $10^{-6}$ cm$^2$/Vs or higher. However, any other substances may also be used as long as the hole-transport property thereof is higher than the electron-transport property thereof. The layer containing a substance having a high hole-transport property is not limited to a single layer, and may be a stack of two or more layers containing any of the above substances.

A carbazole derivative such as CBP, CzPA, or PCzPA or an anthracene derivative such as t-BuDNA, DNA, or DPAnth may be used for the hole-transport layer.

Alternatively, a high molecular compound such as PVK, PVTPA, PTPDMA, or Poly-TPD can be used for the hole-transport layer.

The first light-emitting layer 120 is a layer containing a light-emitting organic compound. As the light-emitting organic compound, for example, a fluorescent compound which emits fluorescence or a phosphorescent compound which emits phosphorescence can be used.

As the fluorescent compound that can be used for the first light-emitting layer 120, a material for blue light emission, a material for green light emission, a material for yellow light emission, and a material for red light emission are given. Examples of the material for blue light emission include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Example of the material for green light emission include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of the material for yellow light emission include rubrene and 5,12-bis (1,1'-biphenyl-4-yl)-6,11-diphenyltetracene (abbreviation: BPT). Examples of the material for red light emission include N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-α]fluoranthene-3,10-diamine (abbreviation: p-mPhAFD).

As the phosphorescent compound that can be used for the first light-emitting layer 120, a material for blue light emission, a material for green light emission, a material for yellow light emission, a material for orange light emission, a material for red light emission are given. Examples of the material for blue light emission include bis[2-(4',6'-difluorophenyl)pyridinato-N,C$^{2'}$]iridium(III)tetrakis(1-pyrazolyl) borate (abbreviation: FIr6), bis[2-(4',6'-difluorophenyl) pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$ (pic)), and bis[2-(4',6'-difluorophenyl)pyridinato-N,C$^{2'}$] iridium(III)acetylacetonate (abbreviation: FIr(acac)).

Examples of the material for green light emission include tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of the material for yellow light emission include bis(2,4-diphenyl-1,3-oxazolato-N,C$^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)). Examples of the material for orange light emission include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)). Examples of the material for red light emission include organometallic complexes such as bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and 2,3,7,8,12,13,17,18-octaethyl-21H,23H-porphyrinplatinum(II) (abbreviation: PtOEP). In addition, rare earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare earth metal ions (electron transition between different multiplicities), and thus can be used as phosphorescent compounds.

Note that the first light-emitting layer 120 may have a structure in which any of the above light-emitting organic compounds (a guest material) is dispersed in another substance (a host material). As a host material, various kinds of materials can be used, and it is preferable to use a substance which has a lowest unoccupied molecular orbital level (LUMO level) higher than the light-emitting substance and has a highest occupied molecular orbital level (HOMO level) lower than that of the light-emitting substance.

As the host material, specifically, any of the following can be used: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(11) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB, TPD, DFLDPBi, and BSPB.

Plural kinds of materials can be used as the host material. For example, in order to suppress crystallization, a substance such as rubrene which suppresses crystallization, may be further added. In addition, NPB, Alq, or the like may be further added in order to efficiently transfer energy to the guest material.

When the structure in which a guest material is dispersed in a host material is employed, crystallization of the first light-emitting layer 120 can be suppressed. In addition, concentration quenching due to high concentration of the guest material can be suppressed.

A high molecular compound can be used for the first light-emitting layer 120. As specific examples of the high molecular compound, a material for blue light emission, a material for green light emission, and a material for orange to red light emission are given. Examples of the material for blue light emission include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), and poly{(9,9-dioctylfluorene-2,7-diyl)-co-[N,N'-di-(p-butylphenyl)-1,4-diaminobenzene]}(abbreviation: TAB-PFH). Examples of the material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1,4-phenylene)]. Examples of the material for orange to red light emission include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-ah-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

Note that the first EL layer 106 may have a structure including two or more light-emitting layers.

The electron-transport layer is a layer containing a substance having a high electron-transport property. As the substance having a high electron-transport property, any of the following can be used, for example: metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato) (4-phenylphenolato)aluminum (abbreviation: BAlq). A metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can also be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1, 3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances given here are mainly ones having an electron mobility of $10^{-6}$ cm$^2$/Vs or higher. The electron-transport layer is not limited to a single layer and may be a stack of two or more layers containing any of the above substances.

The electron-injection layer is a layer containing a substance having a high electron-injection property. For the electron-injection layer, an alkali metal, an alkaline-earth metal, or a compound thereof, such as lithium, cesium, calcium, lithium fluoride, cesium fluoride, calcium fluoride, or lithium oxide, can be used. Alternatively, a rare earth metal compound such as erbium fluoride can be used. Further alternatively, any of the above substances for forming the electron-transport layer can be used.

Charges are generated in the charge generation layer 108 by applying voltage to the light-emitting element. The charge generation layer 108 has functions of injecting holes into the EL layer on the cathode side and injecting electrons into the EL layer on the anode side.

The charge generation layer 108 can be formed using the above composite material. The charge generation layer 108 may have a stacked-layer structure including a layer containing the composite material and a layer containing another material. In that case, as the layer containing another material, a layer containing an electron donating substance and a substance with high electron-transport properties, a layer formed of a transparent conductive film, or the like can be used. As for a light-emitting element having such a structure, problems such as energy transfer and quenching occur with difficulty, and a light-emitting element which has both high light emission efficiency and long lifetime can be easily obtained due to expansion in the choice of materials. Moreover, a light-emitting element which provides phosphorescence from one EL layer and fluorescence from another EL layer can be easily obtained.

When the charge generation layer is provided between the stacked EL layers as illustrated in FIGS. 1A, 1B1, and 1B2, the element can have high luminance and long lifetime while the current density is kept low. In addition, a voltage drop due to the resistance of the electrode material can be reduced, whereby uniform light emission in a large area is possible.

The second EL layer 110 may include at least the second light-emitting layer 122. In addition, the second EL layer 110 can have a stacked-layer structure in which a layer containing a substance having a high hole-transport property, a layer containing a substance having a high electron-transport property, a layer containing a substance having a high hole-injection property, a layer containing a substance having a high electron-injection property, a layer containing a bipolar substance (a substance having a high hole-transport and electron-transport properties), and the like are combined as appropriate. The second EL layer 110 may have a structure similar to that of the first EL layer 106 or may have a stacked-layer structure different from that of the first EL layer 106. For example, the second EL layer 110 can have a stacked-layer structure including a hole-injection layer, a hole-transport layer, the second light-emitting layer 122, an electron-transport layer, an electron-injection buffer layer, an electron-relay layer, and a composite material layer in contact with the electrode 112 having a light-transmitting property. Note that the second EL layer 110 may have a structure including two or more light-emitting layers.

The composite material layer in contact with the electrode 112 having a light-transmitting property is preferably provided, in which case damage caused to the second EL layer 110 particularly when the electrode 112 having a light-transmitting property is formed by a sputtering method can be reduced. The composite material layer can be formed using the above-described composite material in which an acceptor substance is mixed with an organic compound having a high hole-transport property.

Further, by providing the electron-injection buffer layer, an injection barrier between the composite material layer and the electron-transport layer can be reduced; thus, electrons generated in the composite material layer can be easily injected into the electron-transport layer.

A substance having a high electron-injection property can be used for the electron-injection buffer layer: for example, an alkali metal, an alkaline earth metal, a rare earth metal, a compound of the above metal (e.g., an alkali metal compound (including an oxide such as lithium oxide, a halide, or carbonate such as lithium carbonate or cesium carbonate), an alkaline earth metal compound (including an oxide, a halide, or carbonate), or a rare earth metal compound (including an oxide, a halide, or carbonate).

In the case where the electron-injection buffer layer contains a substance having a high electron-transport property and a donor substance, the donor substance is preferably added so that the mass ratio of the donor substance to the substance having a high electron-transport property ranges from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate). Note that as the substance having a high electron-transport property, a material similar to the material for the electron-transport layer described above can be used.

Furthermore, it is preferable that the electron-relay layer be formed between the electron-injection buffer layer and the composite material layer. The electron-relay layer is not necessarily provided; however, by providing the electron-relay layer having a high electron-transport property, electrons can be rapidly transported to the electron-injection buffer layer.

The structure in which the electron-relay layer is sandwiched between the composite material layer and the electron-injection buffer layer is a structure in which the acceptor substance contained in the composite material layer and the donor substance contained in the electron-injection buffer layer are less likely to interact with each other; thus, their functions hardly interfere with each other. Therefore, an increase in the driving voltage can be prevented.

The electron-relay layer contains a substance having a high electron-transport property and is formed so that the LUMO level of the substance having a high electron-transport property is located between the LUMO level of the acceptor substance contained in the composite material layer and the LUMO level of the substance having a high electron-transport property contained in the electron-transport layer. In the case where the electron-relay layer contains a donor substance, the donor level of the donor substance is controlled so as to be located between the LUMO level of the acceptor substance in the composite material layer and the LUMO level of the substance having a high electron-transport property contained in the electron-transport layer. As a specific value of the energy level, the LUMO level of the substance having a high electron-transport property contained in the electron-relay layer is preferably greater than or equal to −5.0 eV, more preferably greater than or equal to −5.0 eV and less than or equal to −3.0 eV.

It is preferable to use a phthalocyanine-based material or a metal complex having a metal-oxygen bond and an aromatic ligand as the substance having a high electron-transport property contained in the electron-relay layer.

As the phthalocyanine-based material contained in the electron relay layer, specifically, any of the following is preferably used: CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron-relay layer, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive the light-emitting element at low voltage more stably.

A phthalocyanine-based material is preferable as a metal complex having a metal-oxygen bond and an aromatic ligand. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that a phthalocyanine-based material having a phenoxy group is preferable as the phthalocyanine-based materials described above. Specifically, a phthalocyanine derivative having a phenoxy group, such as PhO-VOPc, is preferable. A phthalocyanine derivative having a phenoxy group is soluble in a solvent. Thus, a phthalocyanine derivative has an advantage of being easily handled during formation of the light-emitting element and an advantage of facilitating maintenance of an apparatus used for forming a film.

The electron-relay layer may further contain a donor substance. As the donor substance, any of the following can be used: an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate)). When such a donor substance is contained in the electron-relay layer, electrons can be transferred easily and the light-emitting element can be driven at lower voltage.

In the case where a donor substance is contained in the electron-relay layer, in addition to the materials described above as the substance having a high electron-transport property, a substance having a LUMO level greater than the acceptor level of the acceptor substance contained in the composite material layer can be used. Specifically, it is preferable to use a substance having a LUMO level of greater than or equal to −5.0 eV, preferably greater than or equal to −5.0 eV and less than or equal to −3.0 eV. As examples of such a substance, a perylene derivative and a nitrogen-containing condensed aromatic compound are given. Note that a nitrogen-containing condensed aromatic compound is preferably used for the electron-relay layer because of its stability.

Specific examples of the perylene derivative include 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (Hex PTC).

Specific examples of the nitrogen-containing condensed aromatic compound include pirazino[2,3-f][1,10]phenanthroline-2,3-dicarbonitrile (PPDN), 2,3,6,7,10,11-hexacyano-1,4,5,8,9,12-hexaazatriphenylene (HAT(CN)$_6$), 2,3-diphenylpyrido[2,3-b]pyrazine (2PYPR), and 2,3-bis(4-fluorophenyl)pyrido[2,3-b]pyrazine (F2PYPR).

Other than the above, 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophene (abbreviation: DCMT), a methanofullerene (e.g., [6,6]-phenyl C$_{61}$ butyric acid methyl ester), or the like can be used.

Note that in the case where a donor substance is contained in the electron-relay layer, the electron-relay layer may be formed by a method such as co-evaporation of the substance having a high electron-transport property and the donor substance.

Each of the hole-injection layer, the hole-transport layer, the second light-emitting layer 122, and the electron-transport layer may be formed using any of the materials given above. However, a light-emitting material which emits light of a color with a wavelength shorter than that of a color of light emitted from the first light-emitting layer 120 is preferably used as a light-emitting material for the second light-emitting layer 122.

The electrode 112 having a light-transmitting property is provided on the side where light is extracted, and thus is formed using a material having light-transmitting property.

As the material having light-transmitting property, indium oxide, indium tin oxide, an indium oxide-zinc oxide alloy, zinc oxide, zinc oxide to which gallium is added, graphene, or the like can be used.

As the electrode 112 having a light-transmitting property, a metal material such as gold, platinum, nickel, tungsten, chromium, molybdenum, iron, cobalt, copper, palladium, or titanium can be used. A nitride of the metal material (e.g., titanium nitride) or the like may be used. In the case of using the metal material (or the nitride thereof), the electrode 112 having a light-transmitting property may be thinned so as to have a light-transmitting property.

The first EL layer 106, the charge generation layer 108, and the second EL layer 110 in the first light-emitting element 132a and the second light-emitting element 132b are common in pixels and are each formed as a continuous film. Thus, selective deposition using a metal mask is not needed in a manufacturing process, which makes it possible to perform formation over a large area at one time and to increase the size and productivity of a display device. Moreover, a display region in the display portion can be enlarged. Furthermore, a defect due to the entry of particles, or the like, which occurs at the time of using a metal mask, can be prevented; thus, a display device can be manufactured with a high yield.

Note that an inorganic insulating film which covers the first light-emitting element 132a and the second light-emitting element 132b may be provided. The inorganic insulating film serves as a protective layer or a sealing film which blocks an external contaminant such as water. By providing the inorganic insulating film, the deterioration of the light-emitting element can be suppressed; thus, the durability and lifetime of the display device can be improved. A material similar to the material of the inorganic insulator described above can be used as a material of the inorganic insulating film.

A moisture-absorbing substance which serves as a desiccant may be provided between the substrate 100 and the counter substrate 128. The moisture-absorbing substance may be provided in a solid state such as powdery state or may be provided in a state of a film containing a moisture-absorbing substance over the first light-emitting element 132a and the second light-emitting element 132b by a film formation method such as a sputtering method.

A material similar to that of the substrate 100 can be used for the counter substrate 128. Note that the counter substrate 128 needs to have a property of transmitting light passing through at least the first color filter layer 134a and the second color filter layer 134b.

For example, a chromatic color light-transmitting resin can be used as the first color filter layer 134a and the second color filter layer 134b. As the chromatic color light-transmitting resin, a photosensitive organic resin or a non-photosensitive organic resin can be used. The photosensitive organic resin is preferably used, in which case the number of resist masks can be reduced, which results in the simplification of the process.

Chromatic colors are all colors except achromatic colors such as black, gray, and white. The color filter layer is formed using a material which transmits only light of the chromatic colors. As chromatic color, red, green, blue, or the like can be used. Alternatively, cyan, magenta, yellow, or the like may be used. "Transmitting only light of a chromatic color" means that light passing through the color filter layer has a peak at a wavelength of the light of the chromatic color.

The thickness of the color filter layer may be controlled to be optimal as appropriate in consideration of the relationship between the concentration of a coloring material to be contained and the transmittance of light. In the display device described in this embodiment, the half width of a spectrum of light emitted from the first light-emitting layer 120 can be reduced by adjusting the optical path length between the first electrode 102a having a reflective property and the first light-emitting layer 120 and by utilizing light interference. In a similar manner, the half width of a spectrum of light emitted from the second light-emitting layer 122 can be reduced by adjusting the optical path length between the second electrode 102b having a reflective property and the second light-emitting layer 122 and by utilizing light interference. Thus, the concentration of a coloring material of the first color filter layer 134a and the concentration of a coloring material of the second color filter layer 134b can be low. In addition, the thicknesses of the first color filter layer 134a and the second color filter layer 134b can be small. As a result, light absorption by the first color filter layer 134a or the second color filter layer 134b can be reduced; thus, the use efficiency of light can be improved.

The example in which the first color filter layer 134a and the second color filter layer 134b are provided on the inner side of the counter substrate 128 is described in this embodiment. However, one embodiment of the present invention is not limited thereto. The first color filter layer 134a and the second color filter layer 134b can be provided on the outer side of the counter substrate 128 (i.e., on the opposite side to the light-emitting elements).

Alternatively, a light-transmitting resin layer with a chromatic color which functions as a color filter layer may be formed over the first light-emitting element 132a and the second light-emitting element 132b.

A light-blocking layer may be provided in a region between the first color filter layer 134a and the second color filter layer 134b (i.e., a region overlapping with the insulating layer 126). The light-blocking layer is formed using a light-blocking material which reflects or absorbs light. For example, a black organic resin can be used, which can be formed by mixing a black resin of a pigment material, carbon black, titanium black, or the like into a resin material such as photosensitive or non-photosensitive polyimide. Alternatively, a light-blocking metal film can be used, which is made of chromium, molybdenum, nickel, titanium, cobalt, copper, tungsten, aluminum, or the like, for example.

There is no particular limitation on the formation method of the light-blocking layer, and a dry method such as an evaporation method, a sputtering method, or a CVD method, or a wet method such as a spin coating method, a dip coating method, a spray coating method, a droplet discharge method (e.g., ink jetting), a screen printing method, or an offset printing method may be used depending on the material. If needed, an etching method (dry etching or wet etching) may be employed to form a desired pattern.

The light-blocking layer can prevent light from leaking to an adjacent pixel. Therefore, by providing the light-blocking layer, an image can be displayed with high contrast and high definition.

Figure 2A:
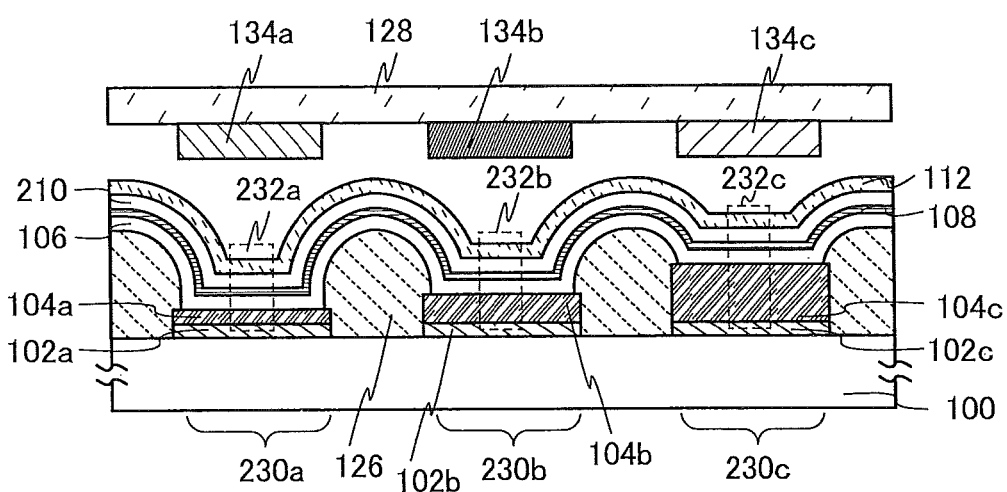
Figure 2A:
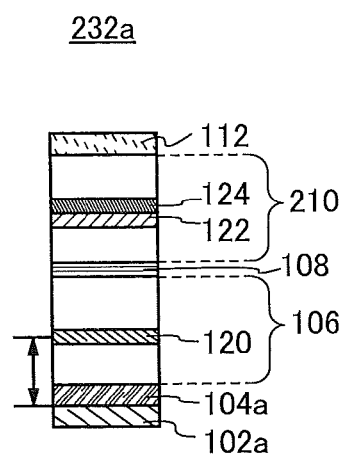
Figure 2A:
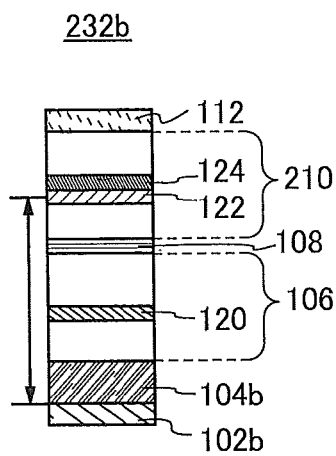
Figure 2A:
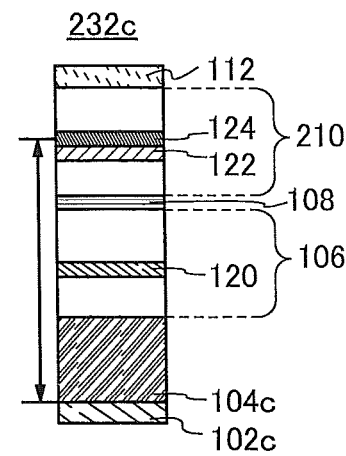

FIGS. 2A, 2B1, 2B2, and 2B3 illustrate one embodiment of a display device which is different from the display device illustrated in FIGS. 1A, 1B1, and 1B2. FIG. 2A is a cross-sectional view of a display portion in the display device. FIGS. 2B1, 2B2, and 2B3 are enlarged views of part of the cross-sectional view of FIG. 2A. The structure of the display device illustrated in FIGS. 2A, 2B1, 2B2, and 2B3 is common with the structure of the display device illustrated in FIGS. 1A, 1B1, and 1B2 in many parts. Therefore, in the following description, the same portions will not be described.

The display device illustrated in FIG. 2A includes a first pixel 230a, a second pixel 230b, and a third pixel 230c. The first pixel 230a includes a first light-emitting element 232a provided over the substrate 100 and the first color filter layer 134a provided for the counter substrate 128 in a region overlapping with the first light-emitting element 232a. The second pixel 230b includes a second light-emitting element 232b provided over the substrate 100 and the second color filter layer 134b provided for the counter substrate 128 in a region overlapping with the second light-emitting element 232b. The third pixel 230c includes a third light-emitting element 232c provided over the substrate 100 and a third color filter layer 134c provided for the counter substrate 128 in a region overlapping with the third light-emitting element 232c.

In the display device illustrated in FIG. 2A, the first color filter layer 134a, the second color filter layer 134b, and the third color filter layer 134c transmit light with different wavelengths. In this embodiment, the case where the central wavelength of the wavelength range of light passing through the first color filter layer 134a ($\lambda 1$) is longer than the central wavelength of the wavelength range of light passing through the second color filter layer 134b ($\lambda 2$), and the central wavelength of the wavelength range of light passing through the second color filter layer 134b ($\lambda 2$) is longer than the central wavelength of the wavelength range of light passing through the third color filter layer 134c (hereinafter, also referred to as $\lambda 3$) will be described as an example.

For example, when the first color filter layer 134a is red, the second color filter layer 134b is green, and the third color filter layer 134c is blue, a display device capable of full-color display can be obtained.

The first light-emitting element 232a includes the first electrode 102a having a reflective property, and the first conductive layer 104a having a light-transmitting property, the first EL layer 106, the charge generation layer 108, a second EL layer 210, and the electrode 112 having a light-transmitting property which are stacked in this order over the first electrode 102a having a reflective property. The second light-emitting element 232b includes the second electrode 102b having a reflective property, and the second conductive layer 104b having a light-transmitting property, the first EL layer 106, the charge generation layer 108, the second EL layer 210, and the electrode 112 having a light-transmitting property which are stacked in this order over the second electrode 102b having a reflective property. The third light-emitting element 232c includes a third electrode 102c having a reflective property, and a third conductive layer 104c having a light-transmitting property, the first EL layer 106, the charge generation layer 108, the second EL layer 210, and the electrode 112 having a light-transmitting property which are stacked in this order over the third electrode 102c having a reflective property.

In FIGS. 2A, 2B1, 2B2, and 2B3, light emitted from the first light-emitting element 232a, the second light-emitting element 232b, and the third light-emitting element 232c is extracted from the electrode 112 side. The first light-emitting element 232a, the second light-emitting element 232b, and the third light-emitting element 232c are electrically insulated from each other by the insulating layer 126.

Figure 3:
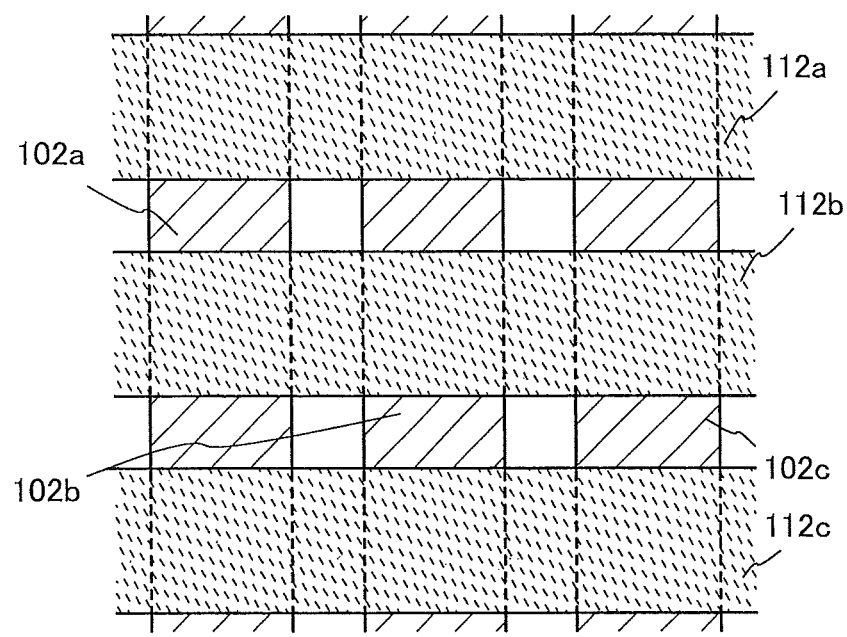

FIG. 2B1 is an enlarged view of the first light-emitting element 232a. FIG. 2B2 is an enlarged view of the second light-emitting element 232b. FIG. 2B3 is an enlarged view of the third light-emitting element 232c.

The first light-emitting element 232a, the second light-emitting element 232b, and the third light-emitting element 232c are different from the first light-emitting element 132a and the second light-emitting element 132b illustrated in FIGS. 1A, 1B1, and 1B2 in the structure of the second EL layer provided over the charge generation layer 108. The first light-emitting element 232a, the second light-emitting element 232b, and the third light-emitting element 232c each include the second EL layer 210 including at least the second light-emitting layer 122 and a third light-emitting layer 124. Note that the second EL layer 210 can have a stacked-layer structure including functional layers such as a hole-injection layer, a hole-transport layer, an electron-transport layer, and an electron-injection layer, in addition to the light-emitting layer. Other structures are similar to the structure of the first light-emitting element 132a or the second light-emitting element 132b.

The first light-emitting element 232a, the second light-emitting element 232b, and the third light-emitting element 232c respectively include the first conductive layer 104a having a light-transmitting property, the second conductive layer 104b having a light-transmitting property, and the third conductive layer 104c having a light-transmitting property which have different thicknesses; therefore, the total thicknesses of the first light-emitting element 232a, the second light-emitting element 232b, and the third light-emitting element 232c are different from one another.

The third conductive layer 104c having a light-transmitting property has a function of adjusting the optical path length of light which is emitted from the third light-emitting layer 124 and reflected back by the third reflected electrode 102c (the light is also referred to as third reflected light) by adjusting the thickness of the third conductive layer 104c having a light-transmitting property. The third reflected light interferes with light entering the third color filter layer 134c directly from the third light-emitting layer 124 (the light is also referred to as third entering light). Thus, the phases of the third entering light and the third reflected light are aligned by adjusting the thickness of the third conductive layer 104c having a light-transmitting property, whereby light emitted from the third light-emitting layer 124 can be amplified. Thus, the luminance of the light-emitting element according to this embodiment is higher than the luminance of a light-emitting element in which the optical path length is not adjusted, in the case where the same current is applied to these light-emitting elements. In addition, the phases of the third entering light and the third reflected light are aligned with the central wavelength of the light passing through the third color filter layer 134c, whereby the color purity of light extracted from the third pixel 230c can be improved.

Specifically, it is preferable that the optical path length between the first electrode 102a having a reflective property and the first light-emitting layer 120 in the first light-emitting element 232a included in the first pixel 230a be one-quarter of the central wavelength of the wavelength range of light passing through the first color filter layer 134a ($\lambda 1$). Moreover, it is preferable that the optical path length between the second electrode 102b having a reflective property and the second light-emitting layer 122 in the second light-emitting element 232b included in the second pixel 230b be three-quarters of the central wavelength of the wavelength range of light passing through the second color filter layer 134b ($\lambda 2$). Furthermore, it is preferable that the optical path length between the third electrode 102c having a reflective property and the third light-emitting layer 124 in the third light-emitting element 232c included in the third pixel 230c be five-quarters of the central wavelength of the wavelength range of light passing through the third color filter layer 134c (λ3).

The central wavelength of the wavelength range of light passing through the first color filter layer 134a and the peak of the spectrum of light emitted from the first light-emitting layer 120 are preferably in the wavelength region exhibiting the same color. The central wavelength of the wavelength range of light passing through the second color filter layer 134b and the peak of the spectrum of light emitted from the second light-emitting layer 122 are preferably in the wavelength region exhibiting the same color. Moreover, the central wavelength of the wavelength range of light passing through the third color filter layer 134c and the peak of the spectrum of light emitted from the third light-emitting layer 124 are preferably in the wavelength region exhibiting the same color.

For example, in the case where the first color filter layer 134a has a central wavelength in the red region (e.g., the case where the central wavelength is 690 nm), the spectrum of light emitted from the first light-emitting layer 120 preferably has a peak in the range of 600 nm to 700 nm. For example, in the case where the second color filter layer 134b has a central wavelength in the green region (e.g., the case where the central wavelength is 550 nm), the spectrum of light emitted from the second light-emitting layer 122 preferably has a peak in the range of 520 nm to 550 nm. For example, in the case where the third color filter layer 134c has a central wavelength in the blue region (e.g., the case where the central wavelength is 450 nm), the spectrum of light emitted from the third light-emitting layer 124 preferably has a peak in the range of 430 nm to 470 nm.

Note that in this embodiment, the central wavelength of the wavelength range of light passing through the first color filter layer 134a is longer than the central wavelength of the wavelength range of light passing through the second color filter layer 134b, and the central wavelength of the wavelength range of light passing through the second color filter layer 134b is longer than the central wavelength of the wavelength range of light passing through the third color filter layer 134c; therefore, it is preferable that the wavelength of a color of light emitted from the first light-emitting layer 120 be longer than the wavelength of a color of light emitted from the second light-emitting layer 122 and that the wavelength of the color of light emitted from the second light-emitting layer 122 be longer than the wavelength of a color of light emitted from the third light-emitting layer 124.

The second EL layer 210 include at least the second light-emitting layer 122 and the third light-emitting layer 124 stacked over the second light-emitting layer 122. The description of the second EL layer 110 may be referred to for the specific structure of the second EL layer 210. Note that a light-emitting material which emits light with a wavelength shorter than the wavelength of a color of light emitted from the second light-emitting layer 122 is used as a light-emitting material of the third light-emitting layer 124.

FIG. 3 is a plan view of a structure of an electrode of a display portion in the display device of this embodiment. Note that some components (e.g., the second EL layer) are omitted in FIG. 3 for easy understanding. The display device in FIG. 3 is a passive matrix display device. In the display device, the electrodes 102 having reflective properties processed in stripes (a first electrode 102a having a reflective property, a second electrode 102b having a reflective property, and a third electrode 102c having a reflective property) and the electrodes 112 having light-transmitting properties processed in stripes (a first electrode 112a having a light-transmitting property, a second electrode 112b having a light-transmitting property, and a third electrode 112c having a light-transmitting property) are stacked to form a lattice.

The first EL layer, the charge generation layer, and the second EL layer are each formed as a continuous film over an entire area between an electrode 102 having a reflective property and the electrode 112 having a light-transmitting property. Thus, selective deposition using a metal mask is not needed.

In the display device described in this embodiment, the optical path length between the electrode having a reflective property and the light-emitting layer is optimized in accordance with the color filter layer exhibiting a color of a pixel, whereby light of each color can be extracted from the pixel with high color purity and high emission efficiency. The light-emitting layer is formed as a continuous film without performing selective deposition of light-emitting layers in pixels with the use of a metal mask. This can prevent a reduction in yield or a complicated process caused by the use of a metal mask. Thus, a high-definition and low-power-consumption display device can be provided.

The structure described in this embodiment can be combined as appropriate with any of the structures described in the other embodiments.

Embodiment 2

Figure 4A:
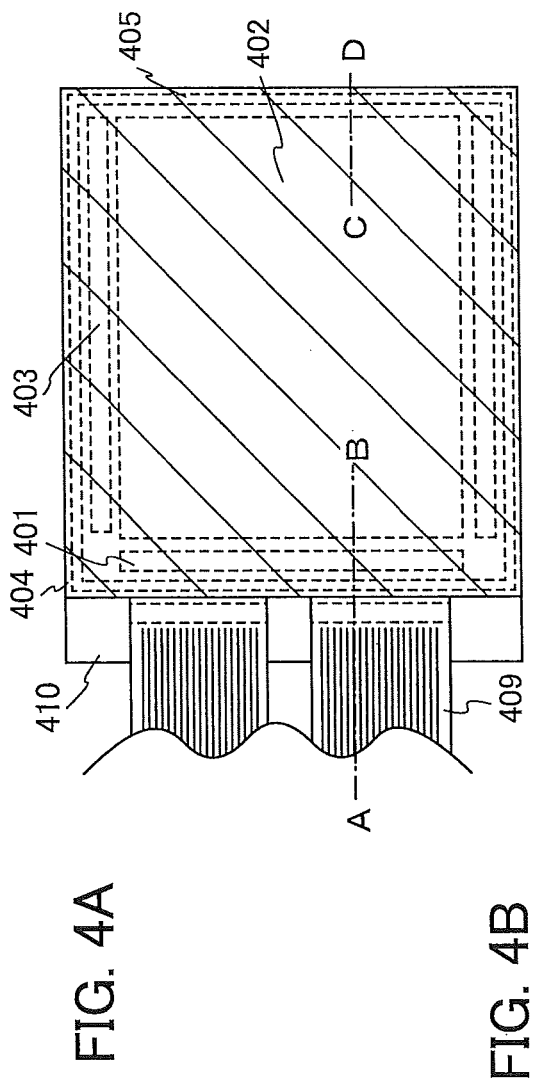
FIGS. 4A and 4B are views illustrating a display device.
Figure 4B:
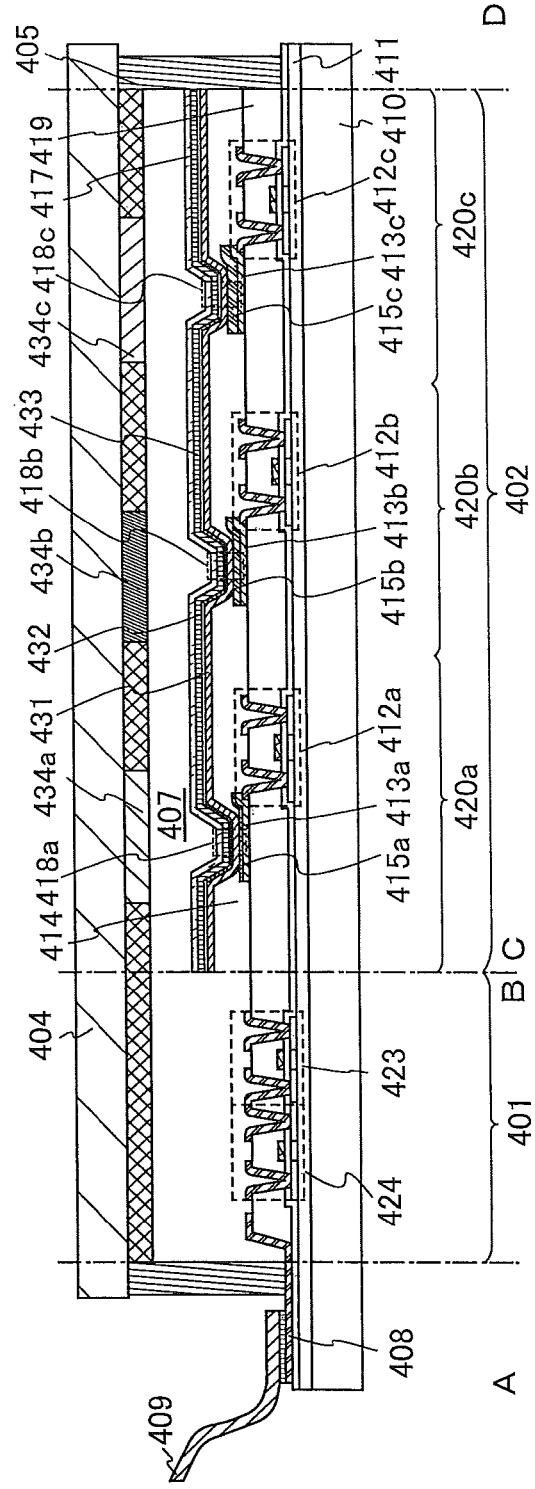

In this embodiment, an active matrix display device that is one embodiment of the present invention will be described with reference to FIGS. 4A and 4B. FIG. 4A is a plan view illustrating a display device. FIG. 4B is a cross-sectional view taken along line A-B and C-D in FIG. 4A In the display device illustrated in FIGS. 4A and 4B, an element substrate 410 and a sealing substrate 404 are attached to each other with a sealant 405, and a driver circuit portion (a source-side driver circuit 401 and a gate side driver circuit 403) and a pixel portion 402 including a plurality of pixels are provided.

Note that a wiring 408 is a wiring for transmitting signals that are to be inputted to the source side driver circuit 401 and the gate side driver circuit 403, and receives a video signal, a clock signal, a start signal, a reset signal, and the like from a flexible printed circuit (FPC) 409 which serves as an external input terminal. Although only the FPC is illustrated here, a printed wiring board (PWB) may be attached to the FPC. The display device in this specification includes not only a display device itself but also a display device to which an FPC or a PWB is attached.

The driver circuit portion (the source side driver circuit 401 and the gate side driver circuit 403) includes a plurality of transistors. A plurality of pixels included in the pixel portion 402 each include a switching transistor, a current controlling transistor, and a first electrode electrically connected to a drain electrode of the current controlling transistor.

Although the driver circuit portion (the source side driver circuit 401 and the gate side driver circuit 403) and the pixel portion 402 are formed over the element substrate 410, FIG. 4B illustrates the source side driver circuit 401 which is the driver circuit portion and three pixels in the pixel portion 402.

The plurality of pixels in the pixel portion 402 each include the switching transistor, the current controlling transistor, and the first electrode electrically connected to a drain electrode of the current controlling transistor. The plurality of pixels include at least two pixels. In this embodiment, an example is described in which pixels of three colors, a red (R) pixel 420*a*, a green (G) pixel 420*b*, and a blue (B) pixel 420*c*, are provided.

The pixels 420*a*, 420*b*, and 420*c* respectively include color filter layers 434*a*, 434*b*, 434*c*; light-emitting elements 418*a*, 418*b*, and 418*c*; and transistors 412*a*, 412*b*, and 412*c* which are respectively electrically connected to the light-emitting elements 418*a*, 418*b*, and 418*c* and function as switching transistors.

The light-emitting elements 418*a*, 418*b*, and 418*c* respectively include a stacked layer of an electrode 413*a* having a reflective property and a conductive layer 415*a* having a light-transmitting property, a stacked layer of an electrode 413*b* having a reflective property and a conductive layer 415*b* having a light-transmitting property, and a stacked layer of an electrode 413*c* having a reflective property and a conductive layer 415*c* having a light-transmitting property. In addition, the light-emitting elements 418*a*, 418*b*, and 418*c* include, over the respective stacked layers, a first EL layer 431 in which a first light-emitting layer is provided, a charge generation layer 432, and a second EL layer 433 in which a second light-emitting layer and a third light-emitting layer are provided, and an electrode 417 having a light-transmitting property.

By adjusting the thickness of the conductive layer 415*a* having a light-transmitting property, the optical path length between the electrode 413*a* having a reflective property and the first light-emitting layer in the red (R) pixel 420*a* is set to one-quarter of the central wavelength of the wavelength range of light passing through the color filter layer 434*a*. By adjusting the thickness of the conductive layer 415*b* having a light-transmitting property, the optical path length between the electrode 413*b* having a reflective property and the second light-emitting layer in the green (G) pixel 420*b* is set to three-quarters of the central wavelength of the wavelength range of light passing through the color filter layer 434*b*. By adjusting the thickness of the conductive layer 415*c* having a light-transmitting property, the optical path length between the electrode 413*c* having a reflective property and the third light-emitting layer in the blue (B) pixel 420*c* is set to five-quarters of the central wavelength of the wavelength range of light passing through the color filter layer 434*c*.

For example, the color filter layer 434*a* of the red (R) pixel 420*a* may be red with a central wavelength of 690 nm, the color filter layer 434*b* of the green (G) pixel 420*b* may be green with a central wavelength of 550 nm, and the color filter layer 434*c* of the blue (B) pixel 420*c* may be blue with a central wavelength of 450 nm.

The optical path length between the electrode having a reflective property and the light-emitting layer is optimized in accordance with the color filter layer exhibiting a color of a pixel, light of each color can be extracted from each pixel with high color purity and high emission efficiency. The light-emitting layer is formed as a continuous film without performing selective deposition of light-emitting layers in pixels with the use of a metal mask. This can prevent a reduction in yield or a complicated process caused by the use of a metal mask. Thus, a high-definition display device with excellent color reproducibility can be provided. Moreover, a low-power-consumption display device can be provided.

A CMOS circuit, which is a combination of an n-channel transistor 423 and a p-channel transistor 424, is formed for the source side driver circuit 401. The driver circuit may be any of a variety of circuits formed with transistors, such as a CMOS circuit, a PMOS circuit, or an NMOS circuit. Although the example in which the source side driver circuit and the gate side driver circuit are formed over a substrate is described in this embodiment, one embodiment of the present invention is not limited thereto. All or part of the source side driver circuit and the gate side driver circuit may be formed outside a substrate, not over the substrate.

Note that an insulator 414 is formed to cover end portions of the electrodes 413*a*, 413*b*, and 413*c* having reflective properties and end portions of the conductive layers 415*a*, 415*b*, and 415*c* having light-transmitting properties. Here, the insulator 414 is formed using a positive type photosensitive acrylic resin film.

In order to improve the coverage, the insulator 414 is provided such that either an upper end portion or a lower end portion of the insulator 414 has a curved surface with a curvature. For example, when positive photosensitive acrylic is used as a material for the insulator 414, it is preferable that only an upper end portion of the insulator 414 have a curved surface with a radius of curvature (0.2 μm to 3 μm). For the insulator 414, it is also possible to use either a negative type photosensitive material that becomes insoluble in an etchant by light irradiation or a positive type photosensitive material that becomes soluble in an etchant by light irradiation.

Any of the materials described in Embodiment 1 can be used for each of the color filter layers 434*a*, 434*b*, and 434*c*, the electrodes 413*a*, 413*b*, and 413*c* having reflective properties, the conductive layers 415*a*, 415*b*, and 415*c* having light-transmitting properties, the first EL layer 431, the charge generation layer 432, the second EL layer 433, and the electrode 417 having a light-transmitting property.

The sealing substrate 404 is attached to the element substrate 410 with the sealant 405; thus, a light-emitting element 418 is provided in a space 407 enclosed by the element substrate 410, the sealing substrate 404, and the sealant 405. Note that the space 407 is filled with a filler and may be filled with an inert gas (e.g., nitrogen or argon), an organic resin, or the sealant 405. A substance having a hygroscopic property may be used as the organic resin and the sealant 405.

Note that an epoxy-based resin is preferably used as the sealant 405. It is preferable that such a material allow as little moisture and oxygen as possible to penetrate. As a material for the sealing substrate 404, a glass substrate, a quartz substrate, or a plastic substrate made of fiberglass-reinforced plastics (FRP), polyvinyl fluoride (PVF), polyester, acrylic, or the like can be used.

As in this embodiment, an insulating film 411 which serves as a base film may be provided between the element substrate 410 and a semiconductor layer of the transistor. The insulating film has a function of preventing diffusion of an impurity element from the element substrate 410 and can be formed to have a single-layer structure or a stacked-layer structure using one or more of a silicon nitride film, a silicon oxide film, a silicon nitride oxide film, and a silicon oxynitride film.

There is no particular limitation on the structure of the transistor which can be used in the display device disclosed in this specification; for example, a staggered type transistor or a planar type transistor having a top-gate structure or a bottom-gate structure can be used. The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and below a channel region with gate insulating layers therebetween.

The gate electrode layers can be formed to have a single-layer or stacked-layer structure using a metal material such as molybdenum, titanium, chromium, tantalum, tungsten, aluminum, copper, neodymium, or scandium, or an alloy material containing any of these materials as its main component.

For example, as a two-layer structure of the gate electrode layer, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a three-layer structure in which a tungsten layer or a tungsten nitride layer, an alloy of aluminum and silicon or an alloy of aluminum and titanium, and a titanium nitride layer or a titanium layer are stacked is preferable.

The gate insulating layer can be formed to have a single-layer structure or a stacked-layer structure using a silicon oxide layer, a silicon nitride layer, a silicon oxynitride layer, and/or a silicon nitride oxide layer by a plasma CVD method, a sputtering method, or the like. Alternatively, a silicon oxide layer formed by a CVD method using an organosilane gas can be used as the gate insulating layer. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

A material of the semiconductor layer is not particularly limited and may be determined as appropriate in accordance with the characteristics needed for the transistors 412a, 412b, 412c, 423, and 424. Examples of materials which can be used for the semiconductor layer will be given.

As the material of the semiconductor layer, any of the following can be used: an amorphous semiconductor manufactured by a sputtering method or a vapor-phase growth method using a semiconductor material gas typified by silane or germane; a polycrystalline semiconductor formed by crystallizing the amorphous semiconductor with the use of light energy or thermal energy; and a microcrystalline semiconductor. The semiconductor layer can be formed by a sputtering method, an LPCVD method, a plasma CVD method, or the like.

A single crystal semiconductor made of silicon or silicon carbide can be used for the semiconductor layer. When a single crystal semiconductor is used for the semiconductor layer, the size of the transistor can be reduced; thus, higher resolution pixels in a display portion can be obtained. In the case where a single crystal semiconductor is used for the semiconductor layer, an SOI substrate in which a single crystal semiconductor layer is provided can be used. Alternatively, a semiconductor substrate such as a silicon wafer may be used.

A typical example of an amorphous semiconductor is hydrogenated amorphous silicon, and a typical example of a crystalline semiconductor is polysilicon and the like. Examples of polysilicon (polycrystalline silicon) include so-called high-temperature polysilicon which contains polysilicon formed at a process temperature of 800° C. or higher as its main component, so-called low-temperature polysilicon which contains polysilicon formed at a process temperature of 600° C. or lower as its main component, and polysilicon obtained by crystallizing amorphous silicon with the use of an element that promotes crystallization. Needless to say, a microcrystalline semiconductor or a semiconductor partly containing a crystal phase can be used as described above.

Further, an oxide semiconductor may be used. As the oxide semiconductor, the following can be used: an oxide of four metal elements such as an In—Sn—Ga—Zn—O-based oxide semiconductor; an oxide of three metal elements such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; or an oxide of two metal elements such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or In—Ga—O-based oxide semiconductor; an In—O-based oxide semiconductor; a Sn—O-based oxide semiconductor; or a Zn—O-based oxide semiconductor. Further, $SiO_2$ may be contained in the above oxide semiconductor. Here, for example, an In—Ga—Zn—O-based oxide semiconductor is an oxide containing at least In, Ga, and Zn, and the composition ratio of the elements is not particularly limited. The In—Ga—Zn—O-based oxide semiconductor may contain an element other than In, Ga, and Zn.

A thin film expressed by a chemical formula of $InMO_3(ZnO)_m$ (m>0) can be used for the oxide semiconductor layer. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, the atomic ratio thereof is In/Zn=0.5 to 50, preferably In/Zn=1 to 20, further preferably In/Zn=1.5 to 15. When the atomic ratio of Zn is in the above preferred range, the field-effect mobility of a transistor can be improved. Here, when the atomic ratio of the compound is In:Zn:O=X:Y:Z, the relation of Z>1.5X+Y is satisfied.

As the oxide semiconductor layer, a CAAC-OS (c-axis aligned crystalline oxide semiconductor) film which is neither completely single crystal nor completely amorphous can be used. The CAAC-OS film is an oxide semiconductor film having a crystal-amorphous mixed structure in which an amorphous phase includes a crystal portion and an amorphous portion. In the crystal portion included in the CAAC-OS film, c-axes are aligned in the direction parallel (including the range of −5° to 5°) to a normal vector of the surface where the CAAC-OS film is formed or a normal vector of the surface of the CAAC-OS film, a triangular or hexagonal atomic arrangement is provided when seen from the direction perpendicular to an a-b plane, and metal atoms are arranged in a layered manner or metal atoms and oxygen atoms are arranged in a layered manner when seen from the direction perpendicular (including the range of 85° to 95°) to the c-axis. Note that the directions of the a-axes and the b-axes may vary between different crystal portions.

As examples of materials for a wiring layer serving as a source electrode layer or a drain electrode layer, the following are given: an element selected from Al, Cr, Ta, Ti, Mo, and W; an alloy containing any of the above elements as its component; an alloy film containing a combination of any of these elements; and the like. In the case where heat treatment is performed, a conductive film preferably has heat resistance high enough to withstand the heat treatment. Since the use of Al alone brings disadvantages such as low heat resistance and a tendency for corrosion, aluminum is used in combination with a conductive material having heat resistance. As the conductive material having heat resistance, which is combined with Al, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, or a nitride containing any of these elements as its component.

An inorganic insulating film or an organic insulating film formed by a dry method or a wet method can be used for an insulating film 419 which covers the transistors. For example, a silicon nitride film, a silicon oxide film, a silicon oxynitride film, an aluminum oxide film, a tantalum oxide film, or a gallium oxide film which is formed by a CVD method, a sputtering method, or the like can be used. Alternatively, an organic material such as polyimide, acrylic, benzocyclobutene, polyamide, or an epoxy resin can be used. Other than the above organic materials, a low-dielectric constant material (a low-k material), a siloxane-based resin, PSG (phosphosilicate glass), BPSG (borophosphosilicate glass), or the like can be used.

Note that the siloxane-based resin corresponds to a resin including a Si—O—Si bond formed using a siloxane-based material as a starting material. The siloxane-based resin may include, as a substituent, an organic group (e.g., an alkyl group or an aryl group) or a fluoro group. The organic group may include a fluoro group. A siloxane-based resin is applied by a coating method and baked; thus, the insulating film 419 can be formed.

Note that the insulating film 419 may be formed by stacking a plurality of insulating films formed using any of the above-described materials. For example, a structure may be employed in which an organic resin film is stacked over an inorganic insulating film.

In the above manner, the active matrix display device including the light-emitting element of one embodiment of the present invention can be obtained.

Note that this embodiment can be freely combined with any of the other embodiments.

Embodiment 3

A display device disclosed in this specification can be applied to a variety of electronic appliances (including game machines). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, and a large-sized game machine such as a pachinko machine.

Figure 5A:
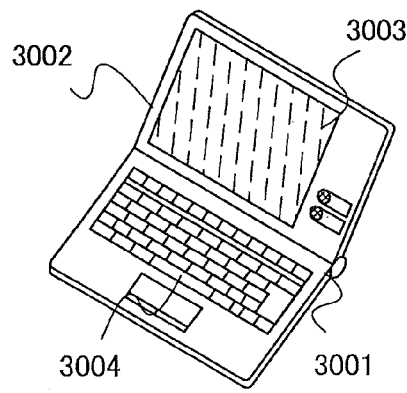
FIGS. 5A to 5F are views each illustrating an example of application of a display device.

FIG. 5A illustrates a laptop personal computer, which includes a main body 3001, a housing 3002, a display portion 3003, a keyboard 3004, and the like. By applying the display device described in Embodiment 1 or 2 to the display portion 3003, the laptop personal computer can have a high level of definition and consumes a small amount of power.

Figure 5B:
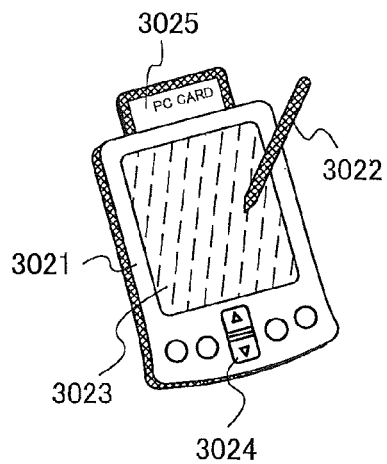

FIG. 5B illustrates a personal digital assistant (PDA), which includes a display portion 3023, an external interface 3025, an operation button 3024, and the like in a main body 3021. The personal digital assistant also includes a stylus 3022 as an accessory for operation. By applying the display device described in Embodiment 1 or 2 to the display portion 3023, the personal digital assistant (PDA) can have a high level of definition and consumes a small amount of power.

Figure 5C:
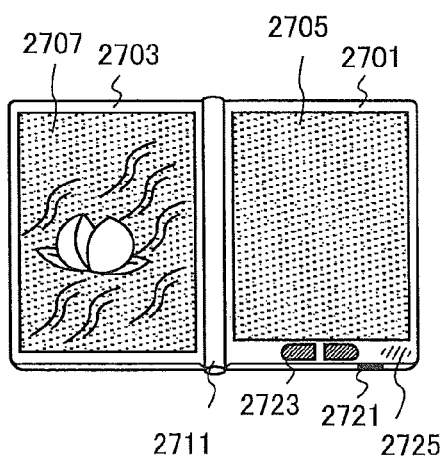

FIG. 5C illustrates an e-book reader, which includes two housings, a housing 2701 and a housing 2703. The housing 2701 and the housing 2703 are combined with a hinge 2711 so that the e-book reader can be opened and closed with the hinge 2711 as an axis. Such a structure enables the e-book reader to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 5C) and graphics can be displayed on a display portion on the left side (the display portion 2707 in FIG. 5C). By applying the display device described in Embodiment 1 or 2 to the display portion 2705 and the display portion 2707, the e-book reader can have a high level of definition and consumes a small amount of power. In the case where a semi-transmissive display device or a reflective display device is used for the display portion 2705, a solar battery may be provided so that the solar battery can generate power and a battery can be charged for the use in relatively bright conditions. Note that when a lithium ion battery is used as the battery, an advantage such as reduction in size can be obtained.

Further, FIG. 5C illustrates an example in which the housing 2701 is provided with an operation portion and the like. For example, the housing 2701 is provided with a power switch 2721, operation keys 2723, a speaker 2725, and the like. Pages can be turned with the operation key 2723. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may wirelessly transmit and receive data. Through wireless communication, desired book data or the like can be purchased and downloaded from an electronic book server.

Figure 5D:
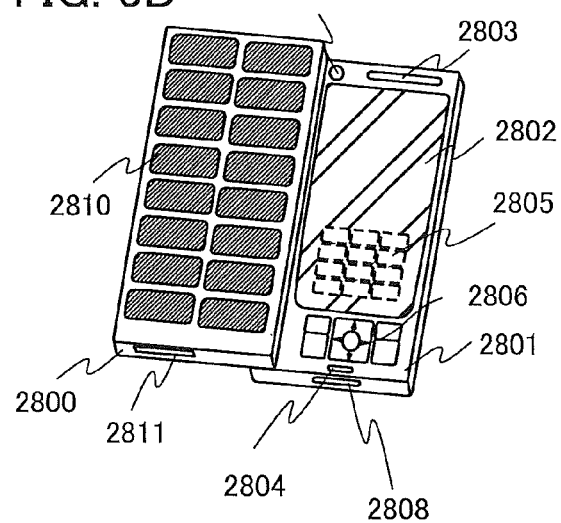

FIG. 5D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charging the mobile phone, an external memory slot 2811, and the like. Further, an antenna is incorporated in the housing 2801. By applying the display device described in Embodiment 1 or Embodiment 2 to the display panel 2802, the mobile phone can have a higher level of definition and consumes a smaller amount of power.

The display panel 2802 is provided with a touch panel. A plurality of operation keys 2805 which are displayed as images are illustrated by dashed lines in FIG. 5D. Note that a boosting circuit by which voltage output from the solar cell 2810 is increased to be sufficiently high for each circuit is also included.

The display direction in the display panel 2802 is changed as appropriate depending on a usage pattern. Further, the mobile phone is provided with the camera lens 2807 on the same surface as the display panel 2802; thus, it can be used as a video phone. The speaker 2803 and the microphone 2804 can be used for videophone calls, recording and playing sound, and the like without limitation to voice calls. Moreover, the housing 2800 and the housing 2801 developed as illustrated in FIG. 5D can be slid so that one is lapped over the other; thus, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, an infrared communication function, a television reception function, or the like may be provided in addition to the above functions.

Figure 5E:
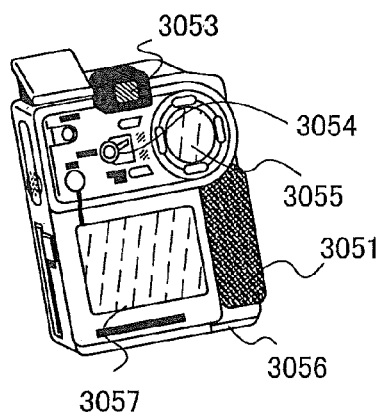

FIG. 5E illustrates a digital video camera, which includes a main body 3051, a display portion A 3057, an eyepiece 3053, an operation switch 3054, a display portion B 3055, a battery 3056, and the like. By applying the display device described in Embodiment 1 or Embodiment 2 to each of the display portion A 3057 and the display portion B 3055, the digital video camera can have a higher level of definition and consumes a smaller amount of power.

Figure 5F:
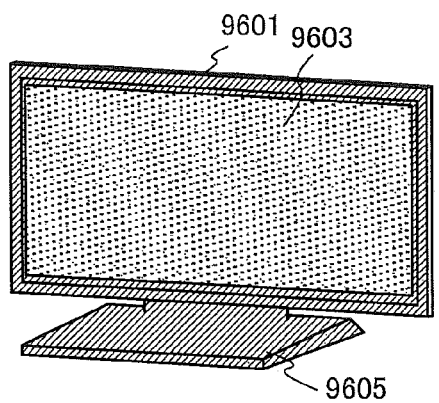

FIG. 5F illustrates a television device in which a display portion 9603 and the like are incorporated in a housing 9601. Images can be displayed on the display portion 9603. Here, the housing 9601 is supported by a stand 9605. By applying the display device described in Embodiment 1 or Embodiment 2 to the display portion 9603, the television device can have a higher level of definition and consumes a smaller amount of power.

The television device can be operated by an operation switch of the housing 9601 or a separate remote controller. Further, the remote controller may be provided with a display portion for displaying data output from the remote controller.

Note that the television device is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

This embodiment can be implemented in an appropriate combination with any of the structures described in the other embodiments.

Note that the structure described in this embodiment can be combined with the structure described in Embodiment 1 or 2 as appropriate.

Example

In this example, measurement results of characteristics of a display device according to one embodiment of the present invention will be described with reference to drawings and tables.

Figure 6:
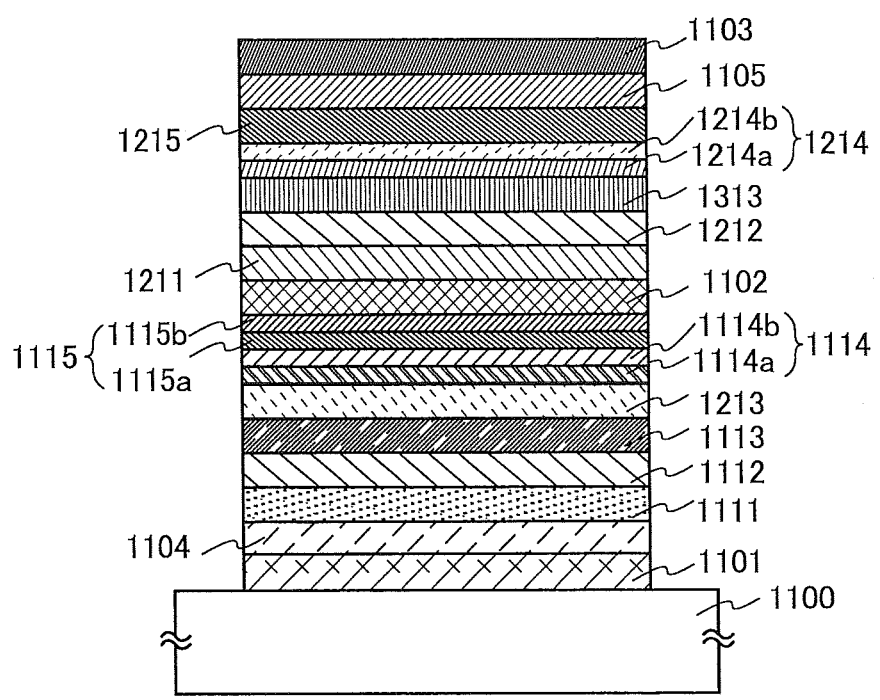
FIG. 6 is a view illustrating a structure of a light-emitting element used in Example.

A manufacturing method of a light-emitting element used in a display device in this example will be described with reference to FIG. 6. The display device of this example includes at least a light-emitting element corresponding to a green pixel (hereinafter, light-emitting element G) and a light-emitting element corresponding to a blue pixel (hereinafter, light-emitting element B).

Shown below are structural formulae of organic compounds used in this example (BPhen, 9-phenyl-3-[4-(10-phenyl-9-anthryl)phenyl]-9H-carbazole (abbreviation: PCzPA), 9-[4-(N-carbazolyl)]phenyl-10-phenylanthracene (abbreviation: CzPA), 4-phenyl-4'-(9-phenylfluoren-9-yl)triphenylamine (abbreviation: BPAFLP), N,N'-bis(3-methylphenyl)-N,N'-bis[3-(9-phenyl-9H-fluoren-9-yl)phenyl]-pyrene-1,6-diamine (abbreviation: 1,6mMemFLPAPrn), 2-[3-(dibenzothiophen-4-yl)phenyl]dibenzo[f,h]quinoxaline (abbreviation: 2mDBTPDBq-II), 4-phenyl-4'-(9-phenyl-9H-carbazol-3-yl)triphenylamine (abbreviation: PCBA1BP), (acetylacetonato)bis(6-tert-butyl-4-phenylpyrimidinato) iridium(III) (abbreviation: Ir(tBuppm)$_2$(acac)), and bis(2,3,5-triphenylpyrazinato)(dipivaloylmethanato)iridium(III) (abbreviation: Ir(tppr)$_2$(dpm))).

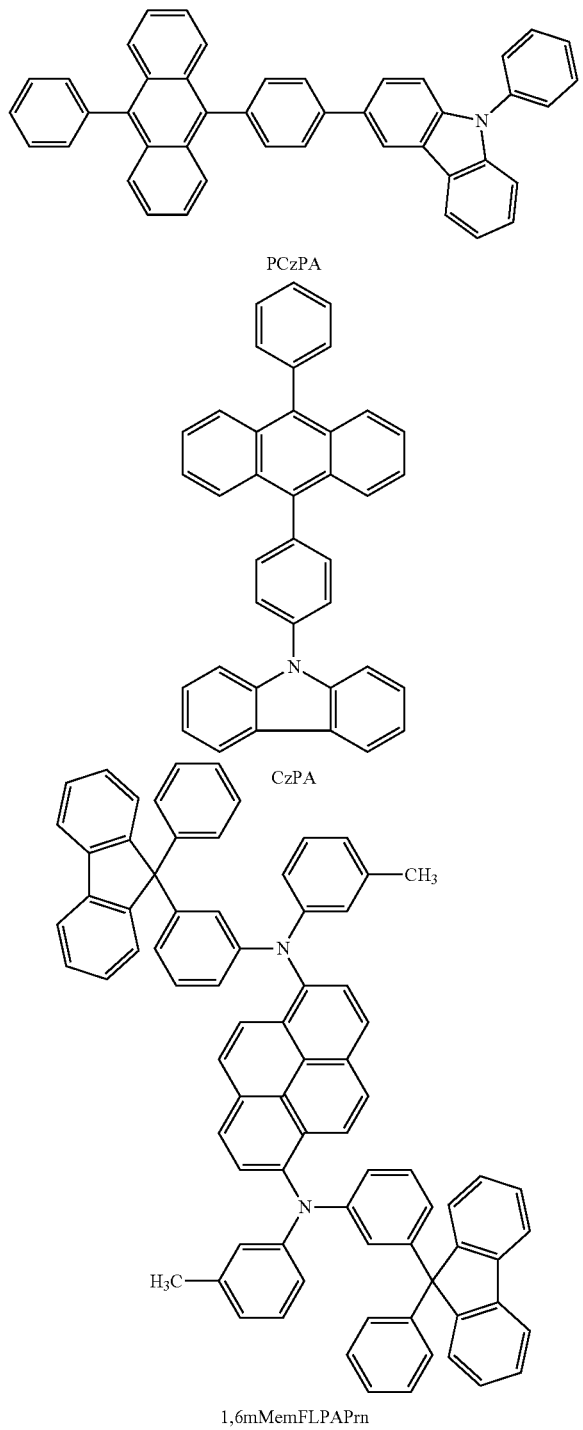

PCzPA

CzPA 1,6mMemFLPAPrn

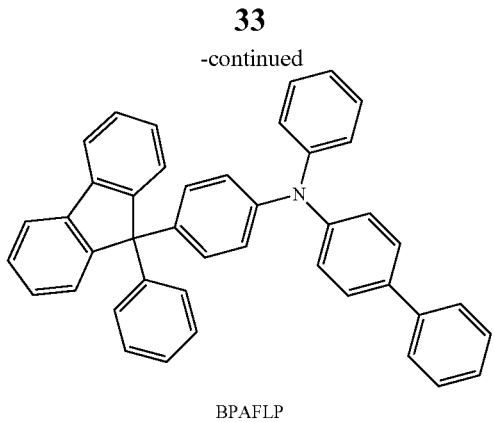

BPAFLP

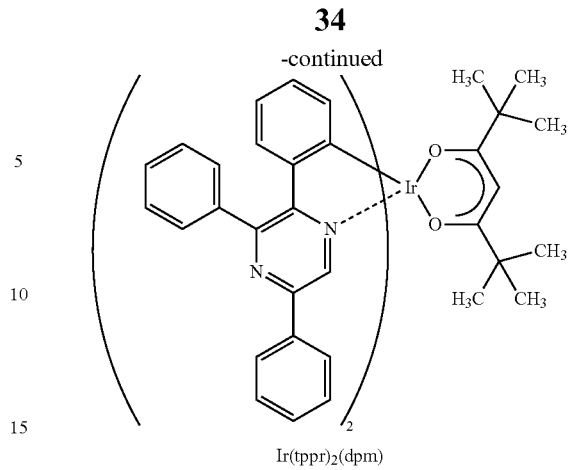

Ir(tppr)₂(dpm)

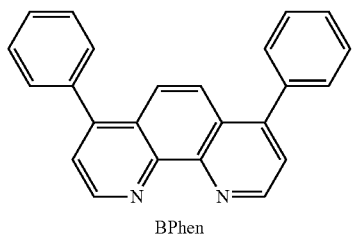

BPhen

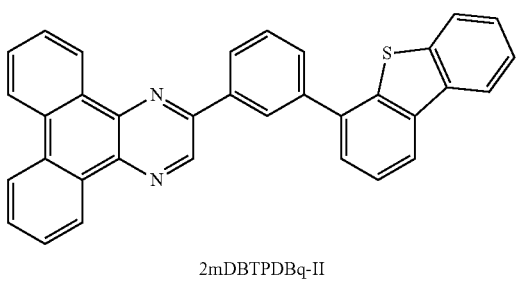

2mDBTPDBq-II

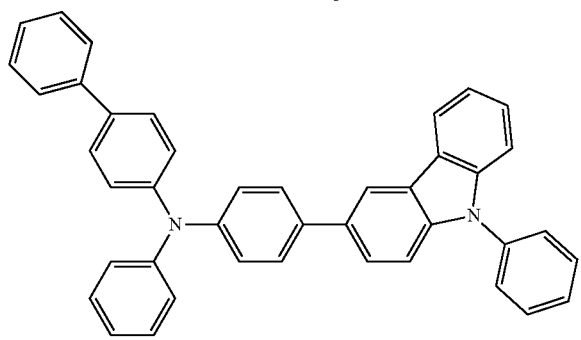

PCBA1BP

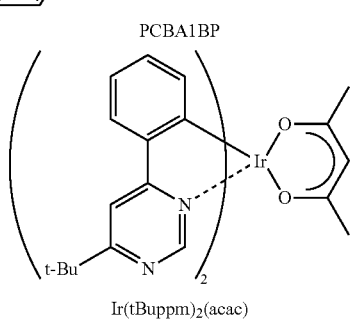

Ir(tBuppm)₂(acac)

As an electrode 1101 having a reflective property of each of the light-emitting element G and the light-emitting element B, an aluminum-titanium alloy film was formed over a substrate 1100 which was a glass substrate by a sputtering method. In this example, the electrode 1101 having a reflective property was used as an anode.

Next, titanium (Ti) and then indium tin oxide containing silicon oxide (ITSO) were deposited over the electrode 1101 having a reflective property by a sputtering method to form a conductive layer 1104 having a light-transmitting property. Note that the deposited Ti was oxidized to be titanium oxide (TiOx) after the sputtering of ITSO, and thus had a light-transmitting property. Then, ITSO was removed by etching in the light-emitting element B.

By the above method, a stacked layer of TiOx with a thickness of 6 nm and ITSO with a thickness of 40 nm was employed as the conductive layer 1104 having a light-transmitting property in the light-emitting element G, and TiOx with a thickness of 6 nm was employed as the conductive layer 1104 having a light-transmitting property in the light-emitting element B in order to obtain a cavity effect in each of a pixel including the light-emitting element B (hereinafter, pixel B) and a pixel including the light-emitting element G (hereinafter, pixel G) in this example. Then, the periphery of the conductive layer 1104 having a light-transmitting property was covered with a polyimide film such that an area of 2 mm×2 mm of the surface was exposed, which corresponded to the electrode area.

Next, the substrate 1100 provided with the electrode 1101 having a reflective property and the conductive layer 1104 having a light-transmitting property was fixed to a substrate holder provided in a vacuum evaporation apparatus such that the surface on which the electrode 1101 having a reflective property and the conductive layer 1104 having a light-transmitting property were formed faced downward, and then the pressure was reduced to about $10^{-4}$ Pa. After that, PCzPA and molybdenum(VI) oxide were co-evaporated on the conductive layer 1104 having a light-transmitting property to form a hole-injection layer 1111. The weight ratio of PCzPA to molybdenum oxide was adjusted to be 1:0.5 (=PCzPA:molybdenum oxide). The thickness of the hole-injection layer 1111 was 5 nm. Note that the co-evaporation method refers to an evaporation method in which evaporation is carried out from a plurality of evaporation sources at the same time in one treatment chamber.

Next, BPAFLP was deposited to a thickness of 10 nm on the hole-injection layer 1111 to form a hole-transport layer 1112.

On the hole-transport layer 1112, 2mDBTPDBq-II, PCBA1BP, and Ir(tBuppm)$_2$(acac) were co-evaporated so that the weight ratio of 2mDBTPDBq-II to PCBA1BP and Ir(tBuppm)$_2$(acac) was 0.8:0.2:0.06 to form a light-emitting layer 1113. The thickness of the light-emitting layer 1113 was 20 nm.

On the light-emitting layer 1113, 2mDBTPDBq-II and Ir(tppr)$_2$(dpm) were co-evaporated so that the weight ratio of 2mDBTPDBq-II to Ir(tppr)$_2$(dpm) was 1:0.06 to form a light-emitting layer 1213. The thickness of the light-emitting layer 1213 was 20 nm.

On the light-emitting layer 1213, 2mDBTPDBq-II was deposited to a thickness of 15 nm to form an electron-transport layer 1114a.

On the electron-transport layer 1114a, bathophenanthroline (abbreviation: BPhen) was deposited to a thickness of 15 nm to form an electron-transport layer 1114b.

On the electron-transport layer 1114b, lithium oxide (Li$_2$O) was evaporated to a thickness of 0.1 nm to form an electron-injection layer 1115a, and on the electron-injection layer 1115a, copper(II) phthalocyanine (abbreviation: CuPc) was evaporated to a thickness of 2 nm to form an electron-injection layer 1115b.

On the electron-injection layer 1115b, PCzPA and molybdenum(VI) oxide were co-evaporated to form a charge generation layer 1102. The weight ratio of PCzPA to molybdenum oxide was adjusted to be 1:0.5 PCzPA:molybdenum oxide). The thickness of the charge generation layer 1102 was 55 nm.

On the charge generation layer 1102, PCzPA was deposited to a thickness of 20 nm to form a hole-transport layer 1212.

On the hole-transport layer 1212, CzPA and 1,6mMem-FLPAPrn were co-evaporated so that the weight ratio of CzPA to 1,6mMemFLPAPrn was 1:0.05 to form a light-emitting layer 1313. The thickness of the light-emitting layer 1313 was 30 nm.

On the light-emitting layer 1313, CzPA was deposited to a thickness of 5 nm to form an electron-transport layer 1214a.

On the electron-transport layer 1214a, BPhen was deposited to a thickness of 15 nm to form an electron-transport layer 1214b.

On the electron-transport layer 1214b, lithium fluoride (LiF) was deposited to a thickness of 1 nm to form an electron-injection layer 1215.

On the electron-injection layer 1215, silver and magnesium were deposited to a thickness of 15 nm so that the volume ratio of silver to magnesium was 10:1 to form a film containing silver and magnesium (AgMg film) as a conductive layer 1105.

On the conductive layer 1105, indium tin oxide (ITO) was deposited to a thickness of 70 nm by a sputtering method to form an electrode 1103 having a light-transmitting property.

Through the above steps, the light-emitting element G and the light-emitting element B which were used in this example were manufactured.

Note that in all of the above evaporation steps, a resistance heating method was employed.

Table 1 shows the element structures of the light-emitting element G and the light-emitting element B which were manufactured in the above manner.

TABLE 1

| | 1101 | 1104 | 1111 | 1112 | 1113 |
|---|---|---|---|---|---|
| light-emitting element G | Al—Ti | TiOx\ITSO 6 nm\40 nm | PCzPA:MoOx (=1:0.5) 5 nm | BPAFLP 10 nm | 2mDBTPDBq-II:PCBA1BP:Ir(tBuppm)$_2$(acac) (=0.8:0.2:0.06) 20 nm |
| light-emitting element B | Al—Ti | TiOx 6 nm | PCzPA:MoOx (=1:0.5) 5 nm | BPAFLP 10 nm | 2mDBTPDBq-II:PCBA1BP:Ir(tBuppm)$_2$(acac) (=0.8:0.2:0.06) 20 nm |

| 1213 | 1114a | 1114b | 1115a | 1115b | 1102 | 1212 |
|---|---|---|---|---|---|---|
| 2mDBTPDBq-II:Ir(tppr)$_2$(dpm) (=1:0.06) 20 nm | 2mDBTPDBq-II 15 nm | BPhen 15 nm | Li$_2$O 0.1 nm | CuPc 2 nm | PCzPA:MoOx (=1:0.5) 55 nm | PCzPA 20 nm |
| 2mDBTPDBq-II:Ir(tppr)$_2$(dpm) (=1:0.06) 20 nm | 2mDBTPDBq-II 15 nm | BPhen 15 nm | Li$_2$O 0.1 nm | CuPc 2 nm | PCzPA:MoOx (=1:0.5) 55 nm | PCzPA 20 nm |

| 1313 | 1214a | 1214b | 1215 | 1105 | 1103 |
|---|---|---|---|---|---|
| CzPA:1,6-mMemFLPAPrn (=1:0.05) 30 nm | CzPA 5 nm | BPhen 15 nm | LiF 1 nm | Ag:Mg (=10:1) 15 nm | ITO 70 nm |
| CzPA:1,6-mMemFLPAPrn (=1:0.05) 30 nm | CzPA 5 nm | BPhen 15 nm | LiF 1 nm | Ag:Mg (=10:1) 15 nm | ITO 70 nm |

The light-emitting element G and the light-emitting element B were sealed with a glass substrate in a glove box under a nitrogen atmosphere so as not to be exposed to the air.

Then, the light-emitting element G and a color filter layer CF (G) overlap to form the pixel G, and the light-emitting element B and a color filter layer CF (B) overlap to form the pixel B.

The color filter layer CF (G) and the color filter layer CF (B) were each formed in such a manner that CB-7001W (manufactured by FUJIFILM Corporation) which was used as a material was applied onto a glass substrate, and then baked at 220° C. for an hour. Note that the thickness was 1.3 µm to 1.4 µm. Note that the color filter material was applied onto the glass substrate by a spin coating method at a spinning rate of 1000 rpm for the color filter layer CF (G) and at a spinning rate of 2000 rpm for the color filter layer CF (B).

Figure 7:
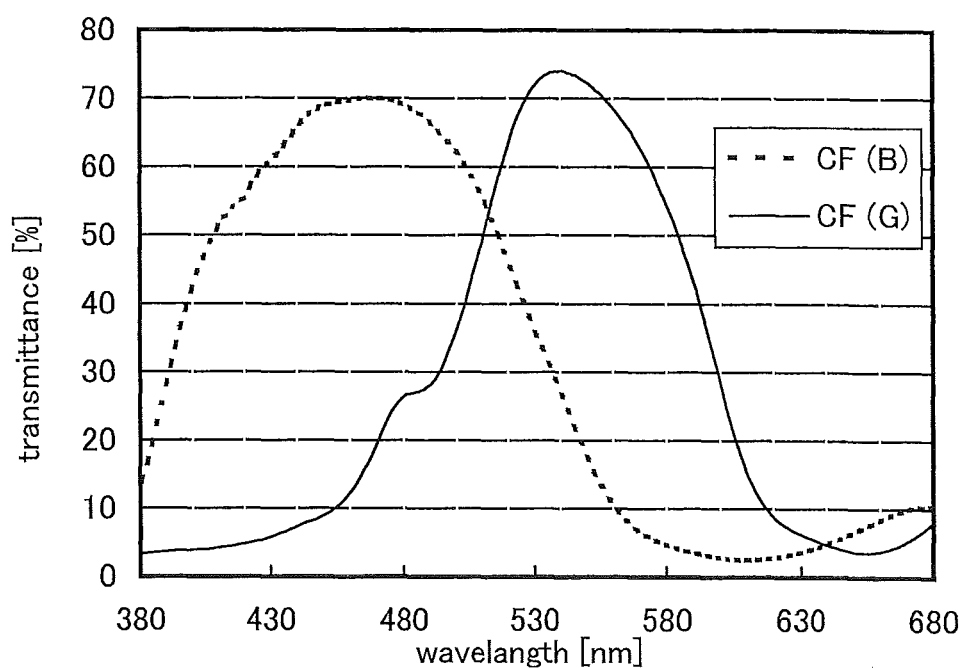
FIG. 7 is a graph showing the relation between wavelengths and transmittance of color filter layers used in Example.

FIG. 7 shows the relation between wavelength and transmittance of the color filter layer CF (G) and the color filter layer CF (B). In FIG. 7, the thin dashed line represents the color filter layer CF (G) and the thick dashed line represents the color filter layer CF (B). The transmittance was measured with U-4000 Spectrophotometer (manufactured by Hitachi High-Technologies Corporation.) by setting light emitted from a light source and passing through the glass substrate to 100%.

FIG. 7 shows that the wavelength range in which the color filter layer CF (G) has a transmittance of 50% or higher in the visible light range (380 nm to 680 nm) is 511 nm to 584 nm and the central wavelength is 548 nm. Moreover, the wavelength range in which the color filter layer CF (B) has a transmittance of 50% or higher in the visible light range (380 nm to 680 nm) is 410 nm to 516 nm and the central wavelength is 463 nm.

In the pixel G described in this example, the optical path length between the electrode 1101 having a reflective property and the light-emitting layer 1113 was set to one-quarter of the central wavelength of light passing through the color filter layer CF (B) by adjusting the thickness of the conductive layer 1104 having a light-transmitting property of the light-emitting element G. Note that the optical path length is calculated by the following formula: refractive index×length (thickness). Table 2 shows the thickness and refractive index at a wavelength of about 548 nm of each layer, which were used for calculating the optical path length of the light-emitting element G, and the calculated optical path lengths.

TABLE 2

|  | Thickness (nm) | Refractive index at about 548 nm | Optical path length (nm) |
|---|---|---|---|
| TiOx | 6 | 2.48 | 14.88 |
| ITSO | 40 | 2.13 | 85.2 |
| CzPA-OMOx | 5 | 1.8 | 9 |
| BPAFLP | 10 | 1.75 | 17.5 |
| Total |  |  | 126.58 |
| ¼ of central wavelength (548 nm) of light passing through CF (G) |  |  | 137 |
| Refractive index of light-emitting layer 1113 (2mDBTPDBq-II) |  |  | 1.8 |
| Light-emitting region (distance from interface between hole-transport layer 1112 and light-emitting layer 1113 to light-emitting region) |  |  | 6 |

Table 2 shows that in the light-emitting element G, the optical path length between a light-emitting region of the light-emitting layer 1113 at about 6 nm from an interface with the hole-injection layer 1111 and the electrode 1101 having a reflective property corresponds to one-quarter of the central wavelength (548 nm) of light passing through the color filter layer CF (G).

Further, in the pixel B, the optical path length between the electrode 1101 having a reflective property and the light-emitting layer 1313 was set to three-quarters of the central wavelength of light passing through the color filter layer CF (B). Table 3 shows the thickness and refractive index at a wavelength of about 463 nm of each layer, which were used for calculating the optical path length of the light-emitting element B, and the calculated optical path lengths.

TABLE 3

|  | Thickness (nm) | Refractive index at about 463 nm | Optical path length (nm) |
|---|---|---|---|
| TiOx | 6 | 2.56 | 15.36 |
| ITSO | 0 | 2.18 | 0 |
| CzPA-OMOx | 5 | 1.86 | 9.3 |
| BPAFLP | 10 | 1.79 | 17.9 |
| Light-emitting layer 1113 (2mDBTPDBq-II) | 20 | 1.86 | 37.2 |
| Light-emitting layer 1213 (2mDBTPDBq-II) | 20 | 1.86 | 37.2 |
| 2mDBTPDBq-II | 15 | 1.86 | 27.9 |
| BPhen | 15 | 1.75 | 26.25 |
| CuPc | 2 | 1.49 | 2.98 |
| PCzPA-OMOx | 55 | 1.91 | 105.05 |
| PCzPA | 20 | 1.92 | 38.4 |
| Total |  |  | 317.54 |
| ¾ of central wavelength (463 nm) of light passing through CF (B) |  |  | 347.25 |
| Refractive index of light-emitting layer 1313 (CzPA) |  |  | 1.86 |
| Light-emitting region (distance from interface between hole-transport layer 1212 and light-emitting layer 1313 to light-emitting region) |  |  | 16 |

Table 3 shows that in the light-emitting element B, the optical path length between a light-emitting region of the light-emitting layer 1313 at about 16 nm from an interface with the hole-transport layer 1212 and the electrode 1101 having a reflective property corresponds to three-quarters of the central wavelength (463 nm) of light passing through the color filter layer CF (B).

The current efficiency, the CIE chromaticity coordinates (x, y), and the voltage of each of the pixel G and the pixel B were measured under the condition in which a luminance of about 1000 cd/m$^2$ was able to be obtained. Note that the measurement was carried out at room temperature (in the atmosphere kept at 25° C.).

As for the pixel G, the current efficiency was 24 cd/A, the CIE chromaticity coordinates were (x, y)=(0.29, 0.68), and the voltage was 6.1 V. As for the pixel B, the current efficiency was 2.3 cd/A, the CIE chromaticity coordinates were (x, y) 0.09), and the voltage was 7.9 V.

Figure 8:
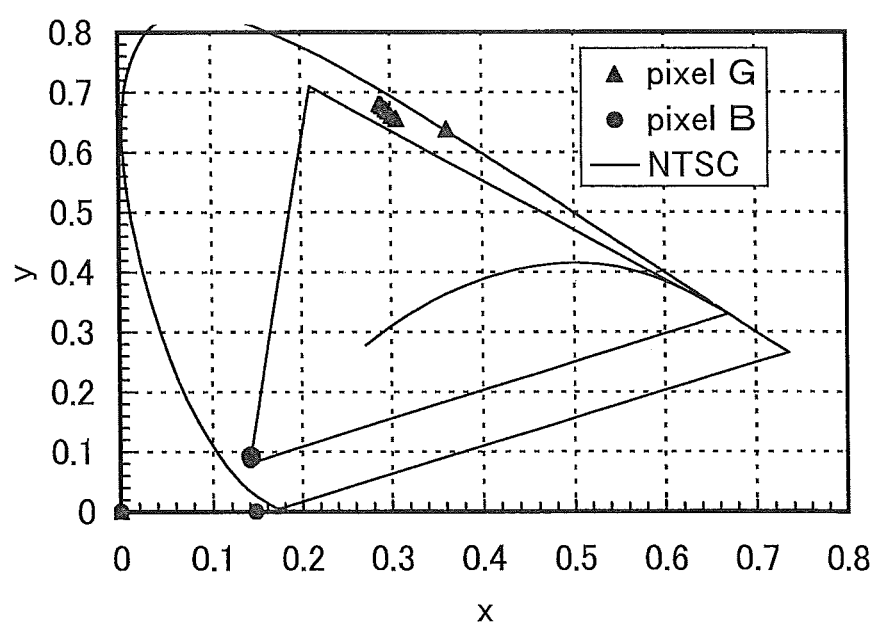
FIG. 8 is a graph showing characteristics of a display device manufactured in Example.

The chromaticities of the pixel G and the pixel B are shown in the chromaticity coordinates in FIG. 8. In FIG. 8, the triangle dot corresponds to the pixel G, the square dot corresponds to the pixel B, and the solid line represents the NTSC ratio defined by NTSC.

FIG. 8 shows that both the pixel G and the pixel B have less deviation from the NTSC ratio, and thus are pixels with high color purity.

The above confirmed that the application of one embodiment of the present invention makes it possible to provide a display device with high color reproducibility which has pixels with high color purity.

EXPLANATION OF REFERENCE

100: substrate, 102: electrode, 102a: electrode, 102b: electrode, 102c: electrode, 104a: conductive layer, 104b: conductive layer, 104c: conductive layer, 106: EL layer, 108: charge generation layer, 110: EL layer, 112: electrode, 112a: electrode, 112b: electrode, 112c: electrode, 120: light-emitting layer, 122: light-emitting layer, 124: light-emitting layer, 126: insulating layer, 128: counter substrate, 130a: pixel, 130b: pixel, 132a: light-emitting element, 132b: light-emitting element, 134a: color filter layer, 134b: color filter layer, 134c: color filter layer, 210: EL layer, 230a: pixel, 230b: pixel, 230c: pixel, 232a:

light-emitting element, 232b: light-emitting element, 232c: light-emitting element, 401: source side driver circuit, 402: pixel portion, 403: gate side driver circuit, 404: sealing substrate, 405: sealant, 407: space, 408: wiring, 410: element substrate, 411: insulating film, 412a: transistor, 412b: transistor, 412c: transistor, 413a: electrode, 413b: electrode, 413c: electrode, 414: insulator, 415a: conductive layer, 415b: conductive layer, 415c: conductive layer, 417: electrode, 418: light-emitting element, 418a: light-emitting element, 418b: light-emitting element, 418c: light-emitting element, 419: insulating film, 420a: pixel, 420b: pixel, 420c: pixel, 423: n-channel transistor, 424: p-channel transistor, 431: EL layer, 432: charge generation layer, 433: EL layer, 434a: color filter layer, 434b: color filter layer, 434c: color filter layer, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switch, 3056: battery, 9601: housing, 9603: display portion, and 9605: stand.

This application is based on Japanese Patent Application serial no. 2011-027961 filed with Japan Patent Office on Feb. 11, 2011, the entire contents of which are hereby incorporated by reference.

What is claimed is:

1. A light-emitting device comprising:
   a first element comprising:
      a first color filter layer; and
      a first light-emitting element,
         wherein the first light-emitting element comprises:
            a first electrode having a reflective property;
            a first light-emitting layer over the first electrode; and
            a second light-emitting layer over the first light-emitting layer; and
   a second element comprising:
      a second color filter layer; and
      a second light-emitting element,
         wherein the second light-emitting element comprises:
            a second electrode having a reflective property;
            the first light-emitting layer over the second electrode; and
            the second light-emitting layer over the first light-emitting layer,
   wherein a first optical path length is an optical path length between the first electrode and the first light-emitting layer, and the first optical path length is one-quarter of a first central wavelength of a first wavelength range in which the first color filter layer has a transmittance of 50% or higher in the visible light range,
   wherein a second optical path length is an optical path length between the second electrode and the second light-emitting layer, and the second optical path length is m-quarters of a second central wavelength of a second wavelength range in which the second color filter layer has a transmittance of 50% or higher in the visible light range,
   wherein m is an odd number of three or more, and
   wherein a wavelength of a color of light emitted from the first light-emitting layer is longer than a wavelength of a color of light emitted from the second light-emitting layer.

2. The light-emitting device according to claim 1,
   wherein the first central wavelength is a median of the first wavelength range, and
   wherein the second central wavelength is a median of the second wavelength range.

3. The light-emitting device according to claim 1,
   wherein the first central wavelength is longer than the second central wavelength.

4. The light-emitting device according to claim 1,
   wherein the second light-emitting element further comprises a first conductive layer having a light-transmitting property between the second electrode and the first light-emitting layer.

5. The light-emitting device according to claim 4,
   wherein the first conductive layer comprises a material selected from a group consisting of indium oxide, indium tin oxide, an indium oxide-zinc oxide alloy, zinc oxide, zinc oxide to which gallium is added, graphene, polyaniline or a derivative thereof, polypyrrole or a derivative thereof, polythiophene or a derivative thereof, and a copolymer of two or more of aniline, pyrrole, and thiophene or a derivative thereof.

6. The light-emitting device according to claim 4,
   wherein the first light-emitting element further comprises a second conductive layer having a light-transmitting property between the first electrode and the first light-emitting layer, and
   wherein the second conductive layer has a different thickness from the first conductive layer.

7. The light-emitting device according to claim 6,
   wherein the second conductive layer comprises a material selected from a group consisting of indium oxide, indium tin oxide, an indium oxide-zinc oxide alloy, zinc oxide, zinc oxide to which gallium is added, graphene, polyaniline or a derivative thereof, polypyrrole or a derivative thereof, polythiophene or a derivative thereof, and a copolymer of two or more of aniline, pyrrole, and thiophene or a derivative thereof.

8. The light-emitting device according to claim 1, further comprising a charge generation layer between the first light-emitting layer and the second light-emitting layer.

9. The light-emitting device according to claim 1, further comprising an electrode having a light-transmitting property over the second light-emitting layer.

10. The light-emitting device according to claim 1,
    wherein the light-emitting device is a display device.

11. The light-emitting device according to claim 1,
    wherein the visible light range is 380 nm to 680 nm.

12. A light-emitting device comprising:
    a first element comprising:
       a first color filter layer; and
       a first light-emitting element,
          wherein the first light-emitting element comprises:
             a first electrode having a reflective property;
             a first light-emitting layer over the first electrode; and
             a second light-emitting layer over the first light-emitting layer; and
    a second element comprising:
       a second color filter layer; and
       a second light-emitting element, wherein the second light-emitting element comprises:
a second electrode having a reflective property;
the first light-emitting layer over the second electrode; and
the second light-emitting layer over the first light-emitting layer,
wherein a first optical path length is an optical path length between a surface of the first electrode and a lower surface of the first light-emitting layer or more and an optical path length between the surface of the first electrode and an upper surface of the first light-emitting layer or less,
wherein the first optical path length is one-quarter of a first central wavelength of a first wavelength range in which the first color filter layer has a transmittance of 50% or higher in the visible light range,
wherein a second optical path length is an optical path length between a surface of the second electrode and a lower surface of the second light-emitting layer or more and an optical path length between the surface of the second electrode and an upper surface of the second light-emitting layer or less,
wherein the second optical path length is m-quarters of a second central wavelength of a second wavelength range in which the second color filter layer has a transmittance of 50% or higher in the visible light range,
wherein m is an odd number of three or more, and
wherein a wavelength of a color of light emitted from the first light-emitting layer is longer than a wavelength of a color of light emitted from the second light-emitting layer.

13. The light-emitting device according to claim 12, wherein the first central wavelength is a median of the first wavelength range, and
wherein the second central wavelength is a median of the second wavelength range.

14. The light-emitting device according to claim 12, wherein the first central wavelength is longer than the second central wavelength.

15. The light-emitting device according to claim 12, wherein the second light-emitting element further comprises a first conductive layer having a light-transmitting property between the second electrode and the first light-emitting layer.

16. The light-emitting device according to claim 15, wherein the first conductive layer comprises a material selected from a group consisting of indium oxide, indium tin oxide, an indium oxide-zinc oxide alloy, zinc oxide, zinc oxide to which gallium is added, graphene, polyaniline or a derivative thereof, polypyrrole or a derivative thereof, polythiophene or a derivative thereof, and a copolymer of two or more of aniline, pyrrole, and thiophene or a derivative thereof.

17. The light-emitting device according to claim 15, wherein the first light-emitting element further comprises a second conductive layer having a light-transmitting property between the first electrode and the first light-emitting layer, and
wherein the second conductive layer has a different thickness from the first conductive layer.

18. The light-emitting device according to claim 17, wherein the second conductive layer comprises a material selected from a group consisting of indium oxide, indium tin oxide, an indium oxide-zinc oxide alloy, zinc oxide, zinc oxide to which gallium is added, graphene, polyaniline or a derivative thereof, polypyrrole or a derivative thereof, polythiophene or a derivative thereof, and a copolymer of two or more of aniline, pyrrole, and thiophene or a derivative thereof.

19. The light-emitting device according to claim 12, further comprising a charge generation layer between the first light-emitting layer and the second light-emitting layer.

20. The light-emitting device according to claim 12, further comprising an electrode having a light-transmitting property over the second light-emitting layer.

21. The light-emitting device according to claim 12, wherein the light-emitting device is a display device.

22. The light-emitting device according to claim 12, wherein the visible light range is 380 nm to 680 nm.

23. A light-emitting device comprising:
a first element comprising:
a first color filter layer; and
a first light-emitting element,
wherein the first light-emitting element comprises:
a first electrode having a reflective property;
a first light-emitting layer over the first electrode;
a second light-emitting layer over the first light-emitting layer; and
a third light-emitting layer over the second light-emitting layer;
a second element comprising:
a second color filter layer; and
a second light-emitting element,
wherein the second light-emitting element comprises:
a second electrode having a reflective property;
the first light-emitting layer over the second electrode;
the second light-emitting layer over the first light-emitting layer; and
the third light-emitting layer over the second light-emitting layer; and
a third element comprising:
a third color filter layer; and
a third light-emitting element,
wherein the third light-emitting element comprises:
a third electrode having a reflective property;
the first light-emitting layer over the third electrode;
the second light-emitting layer over the first light-emitting layer; and
the third light-emitting layer over the second light-emitting layer,
wherein a first optical path length is an optical path length between the first electrode and the first light-emitting layer, and the first optical path length is one-quarter of a first central wavelength of a first wavelength range in which the first color filter layer has a transmittance of 50% or higher in the visible light range,
wherein a second optical path length is an optical path length between the second electrode having a reflective property and the second light-emitting layer in the second element, and the second optical path length is m-quarters of a second central wavelength of a second wavelength range in which the second color filter layer has a transmittance of 50% or higher in the visible light range,
wherein a third optical path length is an optical path length between the third electrode having a reflective property and the third light-emitting layer in the third element, and the third optical path length is n-quarters of a third central wavelength of a third wavelength range in which the third color filter layer has a transmittance of 50% or higher in the visible light range, wherein m is an odd number of three or more, and n is an odd number of three or more, wherein a wavelength of a color of light emitted from the first light-emitting layer is longer than a wavelength of a color of light emitted from the second light-emitting layer, and wherein the wavelength of the color of light emitted from the second light-emitting layer is longer than a wavelength of a color of light emitted from the third light-emitting layer.

24. The light-emitting device according to claim 23,
wherein the first central wavelength is a median of the first wavelength range, and
wherein the second central wavelength is a median of the second wavelength range.

25. The light-emitting device according to claim 23,
wherein the first central wavelength is longer than the second central wavelength, and
wherein the second central wavelength is longer than the third central wavelength.

26. The light-emitting device according to claim 23,
wherein the second light-emitting element further comprises a first conductive layer having a light-transmitting property between the second electrode and the first light-emitting layer,
wherein the third light-emitting element further comprises a second conductive layer having a light-transmitting property between the third electrode and the first light-emitting layer, and
wherein the first conductive layer has a different thickness from the second conductive layer.

27. The light-emitting device according to claim 26,
wherein the first conductive layer comprises a material selected from a group consisting of indium oxide, indium tin oxide, an indium oxide-zinc oxide alloy, zinc oxide, zinc oxide to which gallium is added, graphene, polyaniline or a derivative thereof, polypyrrole or a derivative thereof, polythiophene or a derivative thereof, and a copolymer of two or more of aniline, pyrrole, and thiophene or a derivative thereof, and
wherein the second conductive layer comprises a material selected from a group consisting of indium oxide, indium tin oxide, an indium oxide-zinc oxide alloy, zinc oxide, zinc oxide to which gallium is added, graphene, polyaniline or a derivative thereof, polypyrrole or a derivative thereof, polythiophene or a derivative thereof, and a copolymer of two or more of aniline, pyrrole, and thiophene or a derivative thereof.

28. The light-emitting device according to claim 26,
wherein the first light-emitting element further comprises a third conductive layer having a light-transmitting property between the first electrode and the first light-emitting layer, and
wherein the third conductive layer has a different thickness from the first conductive layer and the second conductive layer.

29. The light-emitting device according to claim 28,
wherein the third conductive layer comprises a material selected from a group consisting of indium oxide, indium tin oxide, an indium oxide-zinc oxide alloy, zinc oxide, zinc oxide to which gallium is added, graphene, polyaniline or a derivative thereof, polypyrrole or a derivative thereof, polythiophene or a derivative thereof, and a copolymer of two or more of aniline, pyrrole, and thiophene or a derivative thereof.

30. The light-emitting device according to claim 26, further comprising a charge generation layer between the first light-emitting layer and the second light-emitting layer,
wherein the second light-emitting layer is in contact with the third light-emitting layer,
wherein a spectrum of light emitted from the first light-emitting layer has a peak in a range of 600 nm to 700 nm,
wherein a spectrum of light emitted from the second light-emitting layer has a peak in a range of 520 nm to 550 nm, and
wherein a spectrum of light emitted from the third light-emitting layer has a peak in a range of 430 nm to 470 nm.

31. The light-emitting device according to claim 26, further comprising an electrode having a light-transmitting property over the third light-emitting layer.

32. The light-emitting device according to claim 23,
wherein the light-emitting device is a display device.

33. The light-emitting device according to claim 23,
wherein the visible light range is 380 nm to 680 nm.

34. A light-emitting device comprising:
a first element comprising:
a first color filter layer; and
a first light-emitting element,
wherein the first light-emitting element comprises:
a first electrode having a reflective property;
a first light-emitting layer over the first electrode;
a second light-emitting layer over the first light-emitting layer; and
a third light-emitting layer over the second light-emitting layer;
a second element comprising:
a second color filter layer; and
a second light-emitting element,
wherein the second light-emitting element comprises:
a second electrode having a reflective property;
the first light-emitting layer over the second electrode;
the second light-emitting layer over the first light-emitting layer; and
the third light-emitting layer over the second light-emitting layer; and
a third element comprising:
a third color filter layer; and
a third light-emitting element,
wherein the third light-emitting element comprises:
a third electrode having a reflective property;
the first light-emitting layer over the third electrode;
the second light-emitting layer over the first light-emitting layer; and
the third light-emitting layer over the second light-emitting layer,
wherein a first optical path length is an optical path length between a surface of the first electrode and a lower surface of the first light-emitting layer or more and an optical path length between the surface of the first electrode and an upper surface of the first light-emitting layer or less,
wherein the first optical path length is one-quarter of a first central wavelength of a first wavelength range in which the first color filter layer has a transmittance of 50% or higher in the visible light range,
wherein a second optical path length is an optical path length between a surface of the second electrode and a lower surface of the second light-emitting layer or more and an optical path length between the surface of the second electrode and an upper surface of the second light-emitting layer or less, wherein the second optical path length is m-quarters of a second central wavelength of a second wavelength range in which the second color filter layer has a transmittance of 50% or higher in the visible light range, wherein a third optical path length is an optical path length between a surface of the third electrode and a lower surface of the third light-emitting layer or more and an optical path length between the surface of the third electrode and an upper surface of the third light-emitting layer or less, wherein the third optical path length is n-quarters of a third central wavelength of a third wavelength range in which the third color filter layer has a transmittance of 50% or higher in the visible light range, wherein m is an odd number of three or more, and n is an odd number of three or more, wherein a wavelength of a color of light emitted from the first light-emitting layer is longer than a wavelength of a color of light emitted from the second light-emitting layer, and wherein the wavelength of the color of light emitted from the second light-emitting layer is longer than a wavelength of a color of light emitted from the third light-emitting layer.

35. The light-emitting device according to claim 34,
wherein the first central wavelength is a median of the first wavelength range, and
wherein the second central wavelength is a median of the second wavelength range.

36. The light-emitting device according to claim 34,
wherein the first central wavelength is longer than the second central wavelength, and
wherein the second central wavelength is longer than the third central wavelength.

37. The light-emitting device according to claim 34,
wherein the second light-emitting element further comprises a first conductive layer having a light-transmitting property between the second electrode and the first light-emitting layer,
wherein the third light-emitting element further comprises a second conductive layer having a light-transmitting property between the third electrode and the first light-emitting layer, and
wherein the first conductive layer has a different thickness from the second conductive layer.

38. The light-emitting device according to claim 37,
wherein the first conductive layer comprises a material selected from a group consisting of indium oxide, indium tin oxide, an indium oxide-zinc oxide alloy, zinc oxide, zinc oxide to which gallium is added, graphene, polyaniline or a derivative thereof, polypyrrole or a derivative thereof, polythiophene or a derivative thereof, and a copolymer of two or more of aniline, pyrrole, and thiophene or a derivative thereof, and
wherein the second conductive layer comprises a material selected from a group consisting of indium oxide, indium tin oxide, an indium oxide-zinc oxide alloy, zinc oxide, zinc oxide to which gallium is added, graphene, polyaniline or a derivative thereof, polypyrrole or a derivative thereof, polythiophene or a derivative thereof, and a copolymer of two or more of aniline, pyrrole, and thiophene or a derivative thereof.

39. The light-emitting device according to claim 37,
wherein the first light-emitting element further comprises a third conductive layer having a light-transmitting property between the first electrode and the first light-emitting layer, and
wherein the third conductive layer has a different thickness from the first conductive layer and the second conductive layer.

40. The light-emitting device according to claim 39,
wherein the third conductive layer comprises a material selected from a group consisting of indium oxide, indium tin oxide, an indium oxide-zinc oxide alloy, zinc oxide, zinc oxide to which gallium is added, graphene, polyaniline or a derivative thereof, polypyrrole or a derivative thereof, polythiophene or a derivative thereof, and a copolymer of two or more of aniline, pyrrole, and thiophene or a derivative thereof.

41. The light-emitting device according to claim 37, further comprising a charge generation layer between the first light-emitting layer and the second light-emitting layer,
wherein the second light-emitting layer is in contact with the third light-emitting layer,
wherein a spectrum of light emitted from the first light-emitting layer has a peak in a range of 600 nm to 700 nm,
wherein a spectrum of light emitted from the second light-emitting layer has a peak in a range of 520 nm to 550 nm, and
wherein a spectrum of light emitted from the third light-emitting layer has a peak in a range of 430 nm to 470 nm.

42. The light-emitting device according to claim 37, further comprising an electrode having a light-transmitting property over the third light-emitting layer.

43. The light-emitting device according to claim 34,
wherein the light-emitting device is a display device.

44. The light-emitting device according to claim 34,
wherein the visible light range is 380 nm to 680 nm.

* * * * *